(12) United States Patent
Sugita et al.

(10) Patent No.: US 7,187,029 B2
(45) Date of Patent: Mar. 6, 2007

(54) NONVOLATILE SEMICONDUCTOR MEMORY DEVICE WITH FLOATING GATE AND TWO CONTROL GATES

(75) Inventors: Yasuhiro Sugita, Tenri (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/230,369

(22) Filed: Aug. 29, 2002

(65) Prior Publication Data

US 2003/0047774 A1 Mar. 13, 2003

(30) Foreign Application Priority Data

Aug. 31, 2001 (JP) ............................. 2001-264158

(51) Int. Cl.
*H01L 29/788* (2006.01)
(52) U.S. Cl. ...................................... 257/320
(58) Field of Classification Search ......... 257/314–326
See application file for complete search history.

(56) References Cited

U.S. PATENT DOCUMENTS

| | | | | |
|---|---|---|---|---|
| 4,599,706 A | * | 7/1986 | Guterman | 365/185.08 |
| 5,280,446 A | * | 1/1994 | Ma et al. | 365/185.15 |
| 5,656,840 A | * | 8/1997 | Yang | 257/316 |
| 5,877,054 A | | 3/1999 | Yamauchi | |
| 5,898,197 A | | 4/1999 | Fujiwara | |
| 5,939,749 A | * | 8/1999 | Taketa et al. | 257/316 |
| 5,986,303 A | * | 11/1999 | Choi et al. | 257/320 |
| 6,154,018 A | * | 11/2000 | Sessions | 323/315 |
| 6,597,037 B1 | * | 7/2003 | Forbes et al. | 257/330 |

FOREIGN PATENT DOCUMENTS

| | | |
|---|---|---|
| JP | 7-312394 A | 11/1995 |
| JP | 09-036264 | 2/1997 |
| JP | 11-224940 | 8/1999 |

OTHER PUBLICATIONS

Wolf; Silicon Processing for the VLSI Era vol. 3 : The Submicron MOSFET; 1995; Lattice Press, Sunset Beach, California; pp. 135-136.*

* cited by examiner

*Primary Examiner*—Marcos D. Pizarro-Crespo
(74) *Attorney, Agent, or Firm*—Nixon & Vanderhye P.C.

(57) ABSTRACT

A nonvolatile semiconductor memory device has a cell which includes a drain diffusion region and a source diffusion region formed on a surface layer of a semiconductor substrate; a first insulating film formed between the source diffusion region and the drain diffusion region; a floating gate formed on the first insulating film; a second insulating film formed on the floating gate; a first control gate formed on the second insulating film; a third insulating film formed on the first control gate and a sidewall thereof and on a sidewall of the floating gate; and a second control gate formed on the first control gate with the third insulating film interposed therebetween.

11 Claims, 24 Drawing Sheets

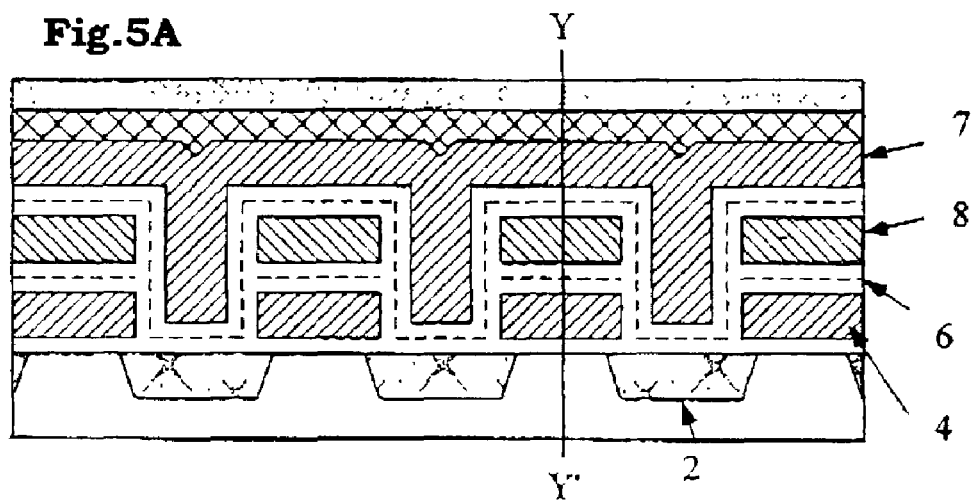
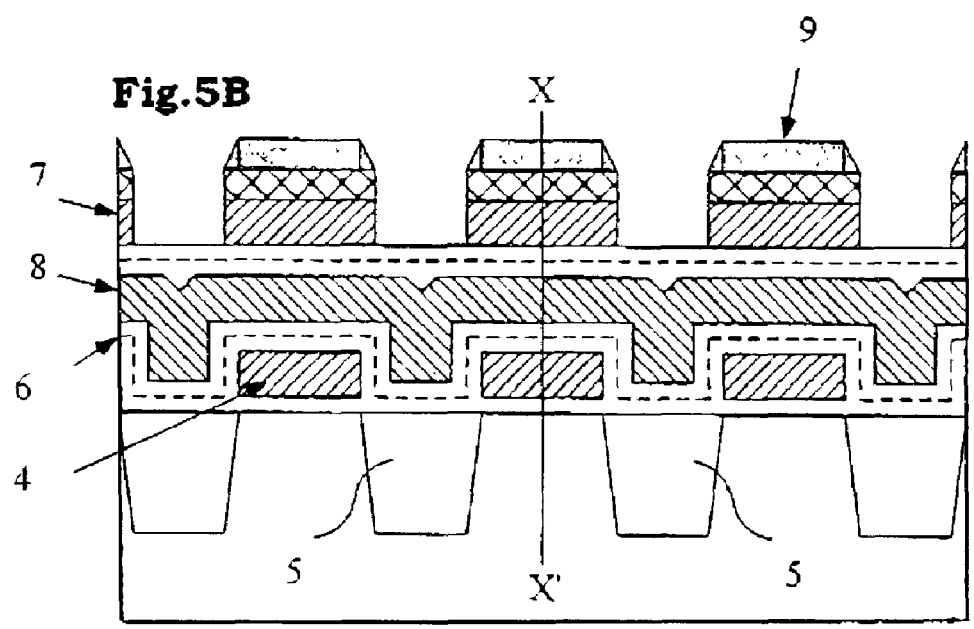

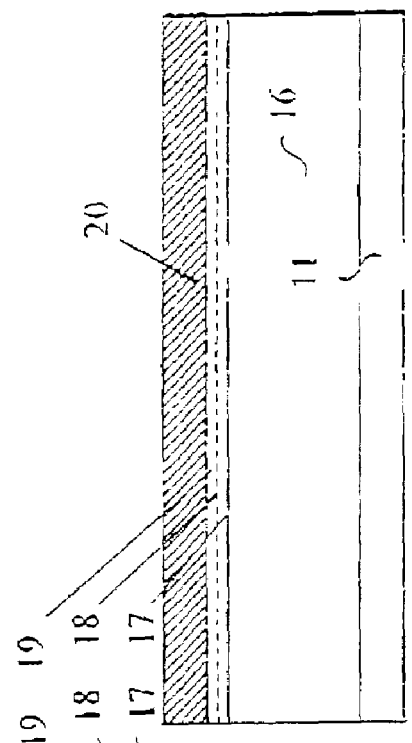
Fig.11A
Fig.11B
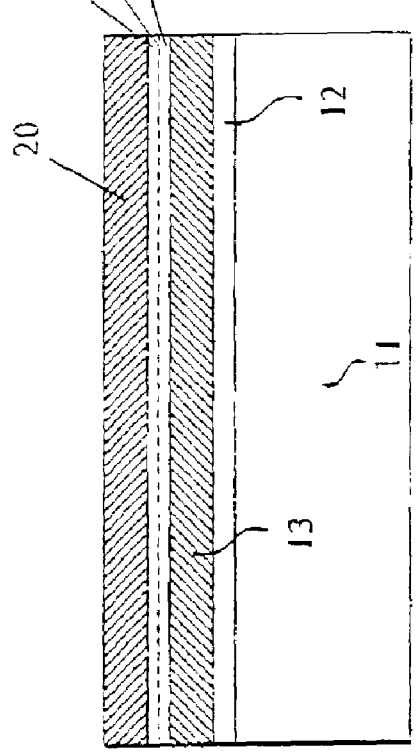
Fig.11C
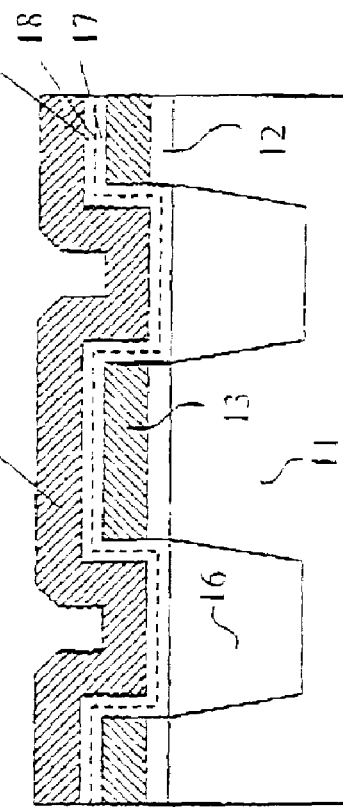
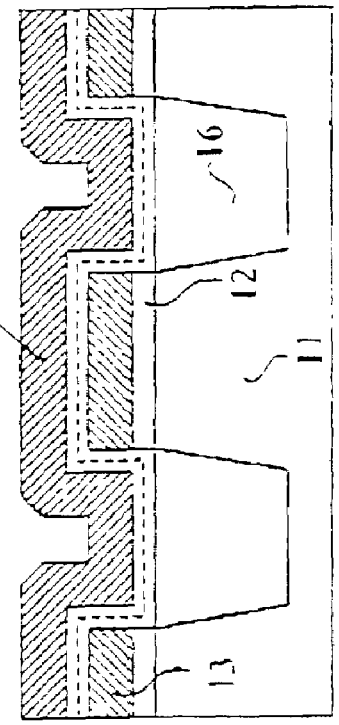
Fig.11D

NONVOLATILE SEMICONDUCTOR MEMORY DEVICE WITH FLOATING GATE AND TWO CONTROL GATES

CROSS-REFERENCE TO RELATED APPLICATION

This application is related to Japanese application No. 2001-264158 filed on Aug. 31, 2001, whose priority is claimed under 35 USC § 119, the disclosure of which is incorporated by reference in its entirety.

BACKGROUND OF THE INVENTION

1. Field of the Invention

The present invention relates to a nonvolatile semiconductor memory device, a fabricating method thereof and an operation method thereof. In more detail, the present invention relates to a nonvolatile semiconductor memory device that has a floating gate and is electrically rewritable, a fabricating method thereof and an operation method thereof.

2. Description of the Related Art

As the existing technology, a configuration (a single source and drain configuration) such as shown in FIGS. 1A and 1B is known. In the figures, reference numerals 1, 2A, 2B, 4, 5, 7A, BL and WL, respectively, denote a semiconductor substrate, a drain diffusion region, a source diffusion region, a floating gate, an oxide film for element isolation, a control gate line, a bit line and a word line. In this configuration, since a pair of impurity regions is necessary for each of cells adjacent in a channel length direction, there is a problem in that an area of the cell becomes larger.

In view of the above problem, there has been proposed a nonvolatile semiconductor memory device that uses a virtual ground array structure and is called an ACT (Asymmetrical Contactless Transistor) type flash memory (U.S. Pat. No. 5,877,054). A sectional view and an array architecture of the memory are shown in FIGS. 2A and 2B.

The ACT type memory cell has an n-channel transistor structure that includes source diffusion regions $2B_1$ and $2B_2$ where an impurity is lightly doped, drain diffusion regions $2A_1$ and $2A_2$ where an impurity is heavily doped, and a floating gate 4, and a control gate line 7A that works as a word line on the floating gate 4. The array configuration takes, as shown in a configuration diagram in FIG. 2B, a virtual ground structure where a source diffusion region $2B_1$ and a drain diffusion region $2A_1$ are shared in common as one impurity diffusion region. An asymmetrical distribution of the impurity concentration in the source and drain diffusion region allows having a simple virtual ground structure in which an FN tunnel phenomenon can be utilized in both write and erase operations. Furthermore, the memory cells are element-isolated between adjacent word lines only by use of PN isolation due to boron implantation, there is no need of a field oxide film. That is, the memory cell is suitable for higher integration. In the figure, reference numeral 6 denotes an ONO stacked film.

Next, a principle of operation of the ACT type memory cell will be shown. In the write operation, first, owing to the FN tunnel phenomenon on a drain side, electrons are extracted from the floating gate into the drain diffusion region, and thereby a threshold voltage is lowered. For instance, when a selected cell is written, voltages of −12 V and +4 V, respectively, are supplied to a selected control gate line and the drain diffusion region, and thereby a threshold value is lowered in the range of from 1 V to 2 V. At this time, an electric field applied to a tunnel oxide film on an n− source diffusion region side of a non-selected adjacent cell becomes smaller than that applied to a tunnel oxide film on the drain diffusion region side of an n+ region. This is because immediately below the tunnel oxide film on the source diffusion region side having an n− region, there is a depletion layer. Accordingly, there occurs no write operation on the adjacent non-selected cells on the same control gate line. This is a reason why the write operation can be conducted by use of the FN tunnel phenomenon, and a virtual ground structure can be realized.

In the erase operation, when voltages of +10 V and −8 V, respectively, are supplied to the selected control gate line and a semiconductor substrate/impurity diffusion layer, because of the FN tunnel phenomenon of a channel region, electrons are injected from the semiconductor substrate into the floating gate, and thereby the threshold voltage is raised to 4 V or more. The erase operation can be conducted for each block and for each control gate line.

In the read operation, a control gate line voltage, a drain voltage and a source voltage, respectively, are set at +3 V, +1 V and 0 V, and whether a selected cell is in a write state or in an erase state is determined according to whether a cell current flows or not.

In FIGS. 2A and 2B, since owing to the asymmetrical source and drain structure, the impurity concentration in the bit line is necessarily divided into an n− region and an n+ region, there is a difficulty in fabrication in comparison with a single source and drain configuration.

At the time of writing, when electrons are extracted from the floating gate into the drain diffusion region side by use of the FN tunnel phenomenon, because of an inter-band tunnel phenomenon, electron-hole pairs are generated. Subsequently, part of holes that flow into the semiconductor substrate, after being accelerated by a depletion layer and obtaining a large energy, is pulled by an electric field (minus potential of the floating gate) in a longitudinal direction and captured by the tunnel oxide film. Because of this capture, the tunnel oxide film is deteriorated, and thereby endurance characteristics and reliability of data storage characteristics are deteriorated. Accordingly, there is a problem -in that when high-speed write operation is conducted, the high reliability cannot be maintained.

Furthermore, there is another problem in that since the read characteristics are largely influenced through the adjacent cells by a leakage current in a transversal direction, it is difficult to obtain a tight threshold value distribution, that is, multi-value storage is difficult.

Still furthermore, as another nonvolatile semiconductor memory device, there is proposed a configuration in which, as shown in FIGS. 3A and 3B, a control gate as a word line is divided into two and disposed in parallel on a floating gate (corresponds to $7A_1$ and $7A_2$ in the figure) (Japanese Unexamined Patent Publication No. HEI 7(1995)-312394). However, since two control gates are disposed in parallel on the floating gate with a second gate insulating film interposed therebetween, there is a problem in that a cell area becomes larger, resulting in difficulty in realizing higher integration.

SUMMARY OF THE INVENTION

According to the present invention, it is provided that a nonvolatile semiconductor memory device comprising a cell which includes:

a drain diffusion region and a source diffusion region formed on a surface layer of a semiconductor substrate;

a first insulating film formed between the source diffusion region and the drain diffusion region;

a floating gate formed on the first insulating film;
a second insulating film formed on the floating gate;
a first control gate formed on the second insulating film;
a third insulating film formed on the first control gate and a sidewall thereof and on a sidewall of the floating gate; and
a second control gate formed on the first control gate with the third insulating film interposed therebetween.

Furthermore, according to the present invention, it is provided that a method for fabricating a nonvolatile semiconductor memory device comprising formation of a cell, the formation of the cell comprising the steps of:

(a) stacking a first insulating film and a first conductor film in this order on a semiconductor substrate and forming a floating gate by processing the first conductor film;

(b) stacking a second insulating film and a second conductor film in this order on the floating gate and forming a first control gate by processing the second conductor film;

(c) implanting an impurity, with the first control gate as a mask, in a surface layer of the semiconductor substrate, thereby forming a drain diffusion region and a source diffusion region;

(d) forming a third insulating film on the first control gate and a sidewall thereof and on a sidewall of the floating gate; and (e) stacking a third conductor film on the third insulating film and, by processing the third conductor film, forming a second control gate on the first control gate with the third insulating film interposed therebetween.

Still furthermore, according to the present invention, it is provided that a method for operating a nonvolatile semiconductor memory device that includes a plurality of cells in the channel length direction and in a channel width direction, wherein first control gates of a line of cells continuous in the channel length or width direction are shared in common as one first control gate line, and second control gates of a line of cells continuous in a direction perpendicular to the first control gate line are shared in common as one second control gate line;

(A) a writing method for a nonvolatile semiconductor memory device, comprising supplying a predetermined positive voltage to the first control gate line and the second control gate line of a selected cell and grounding the semiconductor substrate, thereby injecting electrons from the semiconductor substrate into the floating gate of the selected cell for conducting a writing operation, or supplying a predetermined negative voltage to the first control gate line and the second control gate line of the selected cell and grounding the semiconductor substrate, thereby injecting electrons from the floating gate of the selected cell into the semiconductor substrate for conducting a writing operation;

(B) a writing method for a nonvolatile semiconductor memory device, comprising supplying a predetermined positive voltage to the first control gate line and the second control gate line of a selected cell, supplying a voltage lower than the above positive voltage to the semiconductor substrate and supplying a voltage substantially the same as the voltage to the semiconductor substrate to a bit line of the selected cell or disconnecting the bit line, thereby injecting electrons from the semiconductor substrate into the floating gate of the selected cell for conducting a write operation, or supplying a predetermined negative voltage to the first control gate line and the second control gate line of the selected cell, supplying a voltage higher than the above negative voltage to the semiconductor substrate and supplying a voltage substantially the same as the voltage to the semiconductor substrate to a bit line of the selected cell or disconnecting the bit line, thereby injecting electrons from the floating gate of the selected cell into the semiconductor substrate for conducting a write operation;

(C) an erasing method for a nonvolatile semiconductor memory device, comprising supplying a predetermined negative voltage to the first control gate line of a selected cell and grounding the semiconductor substrate, thereby injecting electrons from the floating gate of the selected cell into the semiconductor substrate for conducting an erase operation, or supplying a predetermined positive voltage to the first control gate line of the selected cell and grounding the semiconductor substrate, thereby injecting electrons from the semiconductor substrate into the floating gate of the selected cell for conducting an erase operation;

(D) an erasing method for a nonvolatile semiconductor memory device, comprising supplying a predetermined negative voltage to the first control gate line of a selected cell, supplying a voltage higher than the above negative voltage to the semiconductor substrate and supplying a voltage substantially the same as the voltage to the semiconductor substrate to a bit line of the selected cell or disconnecting the bit line, thereby injecting electrons from the floating gate of the selected cell into the semiconductor substrate for conducting an erase operation, or supplying a predetermined positive voltage to the first control gate line of the selected cell, supplying a voltage lower than the above positive voltage to the semiconductor substrate and supplying a voltage substantially the same as the voltage to the semiconductor substrate to a bit line of the selected cell or disconnecting the bit tine, thereby injecting electrons from the semiconductor substrate into the floating gate of the selected cell for conducting an erase operation;

(E) an erasing method for a nonvolatile semiconductor memory device, comprising supplying a predetermined negative voltage to the second control gate line of a selected cell and grounding the semiconductor substrate, thereby injecting electrons from the floating gate of the selected cell into the semiconductor substrate for conducting an erase operation, or supplying a predetermined positive voltage to the second control gate line of the selected cell and grounding the semiconductor substrate, thereby injecting electrons from the semiconductor substrate into the floating gate of the selected cell for conducting an erase operation+

(F) an erasing method for a nonvolatile semiconductor memory device, comprising supplying a predetermined negative voltage to the second control gate line of a selected cell, supplying a voltage higher than the above negative voltage to the semiconductor substrate and supplying a voltage substantially the same as the voltage to the semiconductor substrate to a bit line of the selected cell or disconnecting the bit line, thereby injecting electrons from the floating gate of the selected cell into the semiconductor substrate for conducting an erase operation, or supplying a predetermined positive voltage to the second control gate line of the selected cell, supplying a voltage lower than the above positive voltage to the semiconductor substrate and supplying a voltage substantially the same as the voltage to the semiconductor substrate to a bit line of the selected cell or disconnecting the bit line, thereby injecting electrons from the semiconductor substrate into the floating gate of the selected cell for conducting an erase operation;

(G) an erasing method for a nonvolatile semiconductor memory device, comprising supplying a predetermined negative voltage to the first control gate line and the second control gate line of a selected cell and grounding the semiconductor substrate, thereby injecting electrons from the floating gate of the selected cell into the semiconductor substrate for conducting an erase operation, or supplying a predetermined positive voltage to the first control gate line and the second control gate line of the selected cell and grounding the semiconductor substrate, thereby injecting electrons from the semiconductor substrate into the floating gate of the selected cell for conducting an erase operation;

(H) an erasing method for a nonvolatile semiconductor memory device, comprising supplying a predetermined negative voltage to the first control gate line and the second control gate line of a selected cell, supplying a voltage higher than the above negative voltage to the semiconductor substrate and supplying a voltage substantially the same as the voltage to the semiconductor substrate to a bit line of the selected cell or disconnecting the bit line, thereby injecting electrons from the floating gate of the selected cell into the semiconductor substrate for conducting an erase operation, or supplying a predetermined positive voltage to the first control gate line and the second control gate line of the selected cell, supplying a voltage lower than the above positive voltage to the semiconductor substrate, and supplying a voltage substantially the same as the voltage to the semiconductor substrate to a bit line of the selected cell or disconnecting the bit line, thereby injecting electrons from the semiconductor substrate into the floating gate of the selected cell for conducting an erase operation;

(I) a reading method for a nonvolatile semiconductor memory device, comprising supplying a predetermined positive voltage to the second control gate line of a selected cell and a bit line corresponding to the source diffusion region of the selected cell and grounding a bit line corresponding to the drain diffusion region of the selected cell, thereby conducting a reading operation;

(J) a reading method for a nonvolatile semiconductor memory device, comprising supplying a predetermined positive voltage to the first control gate line and the second control gate line of a selected cell and a bit line corresponding to the source diffusion region of the selected cell and grounding a bit line corresponding to the drain diffusion region of the selected cell, thereby conducting a reading operation;

(K) a reading method for a nonvolatile semiconductor memory device, comprising supplying a predetermined positive voltage to the second control gate lines of selected cells, supplying a positive voltage to odd-numbered first control gate lines and bit lines corresponding to odd-numbered drain diffusion regions and grounding even-numbered first control gate lines and bit lines corresponding to even-numbered source diffusion regions, thereby reading odd-numbered cells of the selected cells, and subsequently, while supplying the predetermined positive voltage to the second control gate lines of the selected cells, supplying a positive voltage to even-numbered first control gate lines and bit lines corresponding to even-numbered drain diffusion regions and grounding odd-numbered first control -ate lines and bit lines corresponding to odd-numbered source diffusion regions, thereby reading even-numbered ones of the selected cells;

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 5(A) and 5(B) are schematic sectional views of the non-volatile semiconductor memory device of FIG. 4;

FIGS. 11(A) to 11(D) are schematic sectional views illustrating a production process of a non-volatile semiconductor memory device in accordance with the present invention;

DESCRIPTION OF THE PREFERRED EMBODIMENTS

Figure 1A:
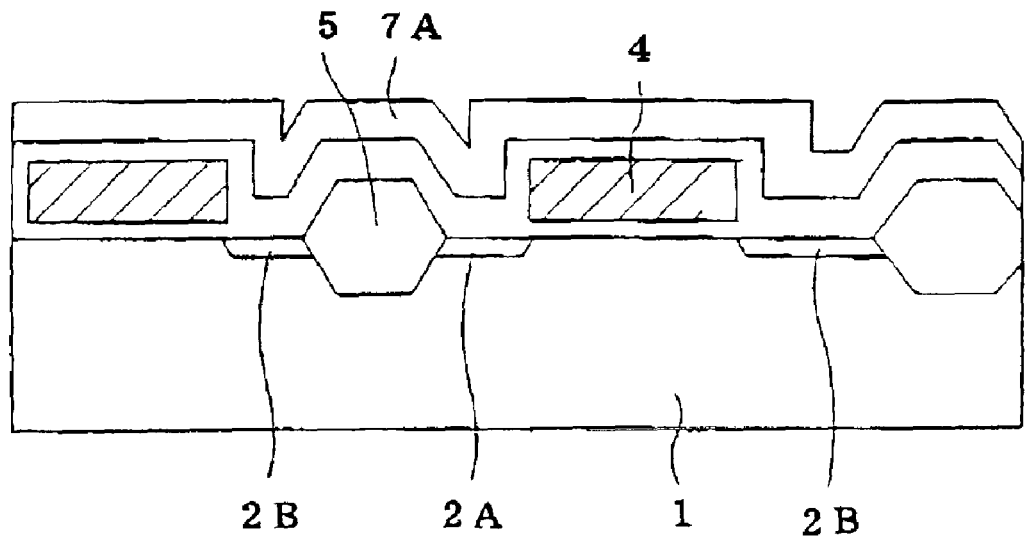
FIGS. 1(A) and 1(B) are a schematic sectional view and a circuit diagram, respectively, of a prior-art non-volatile semiconductor memory device.
Figure 1B:
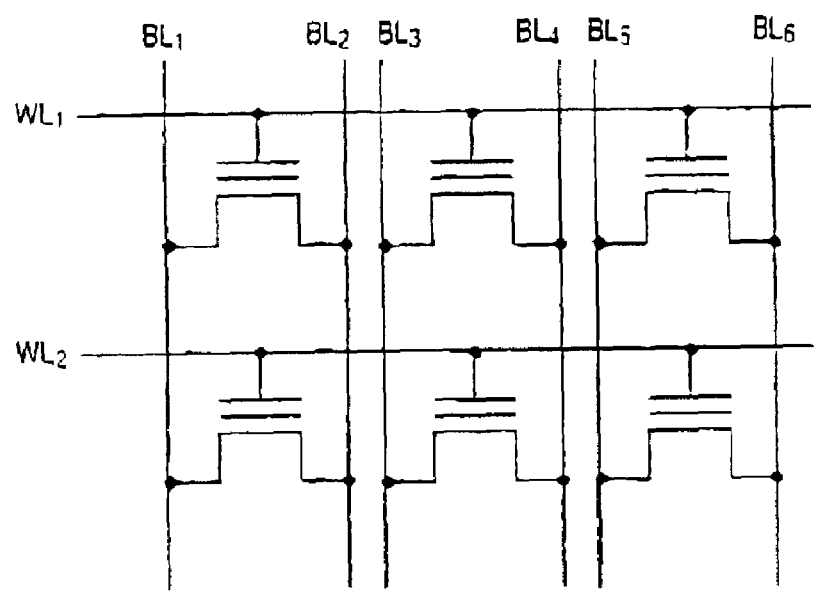
Figure 2A:
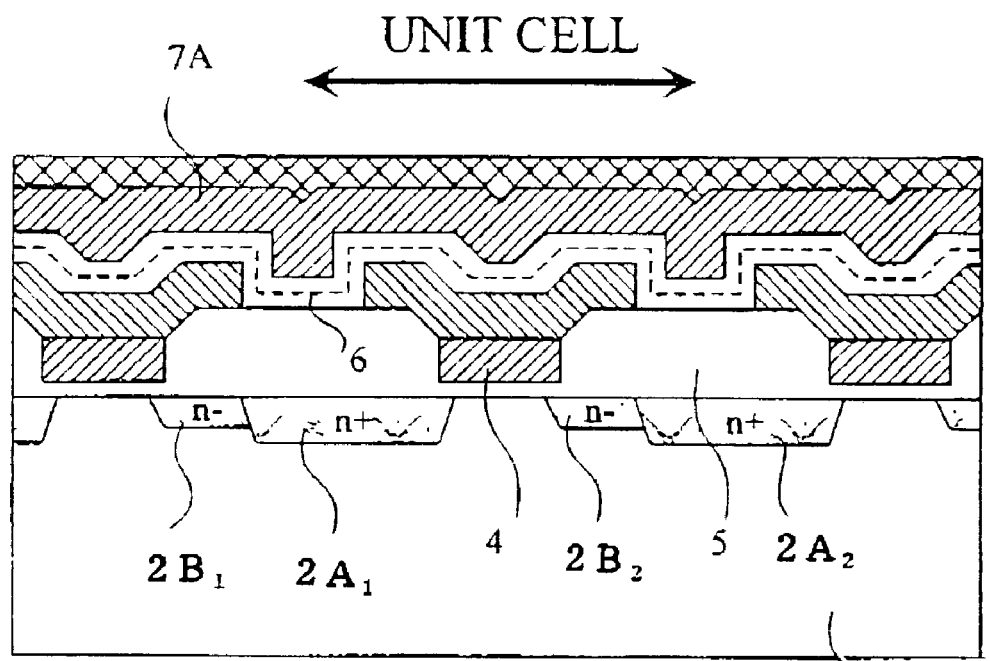
FIGS. 2(A) and 2(B) are a schematic sectional view and a schematic plan view of a prior-art non-volatile semiconductor memory device.
Figure 2B:
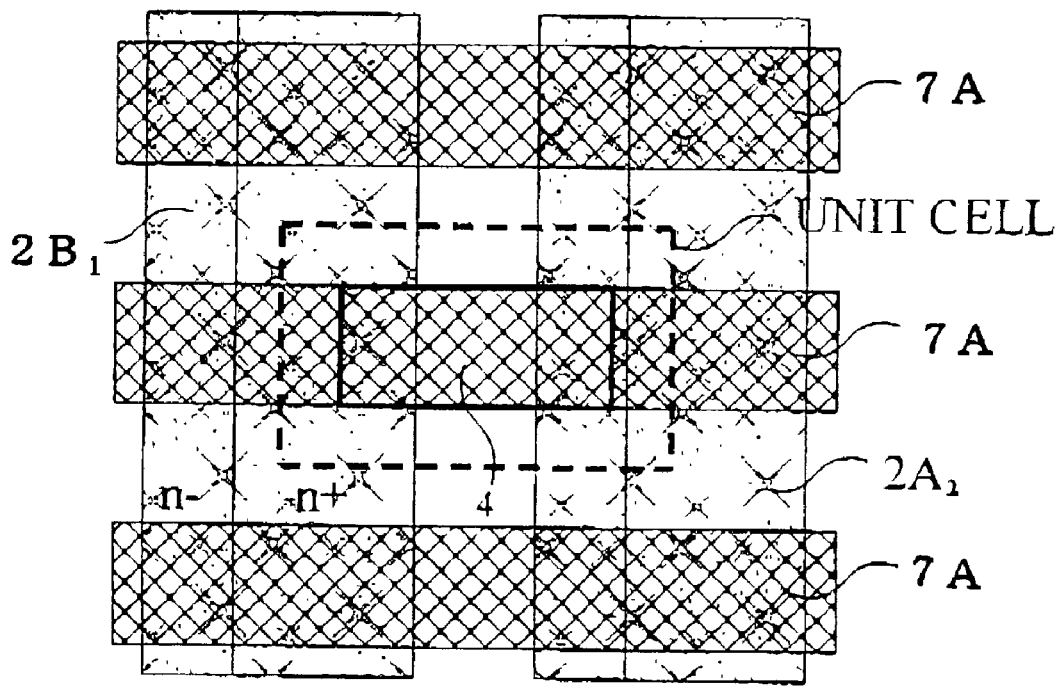
Figure 3:
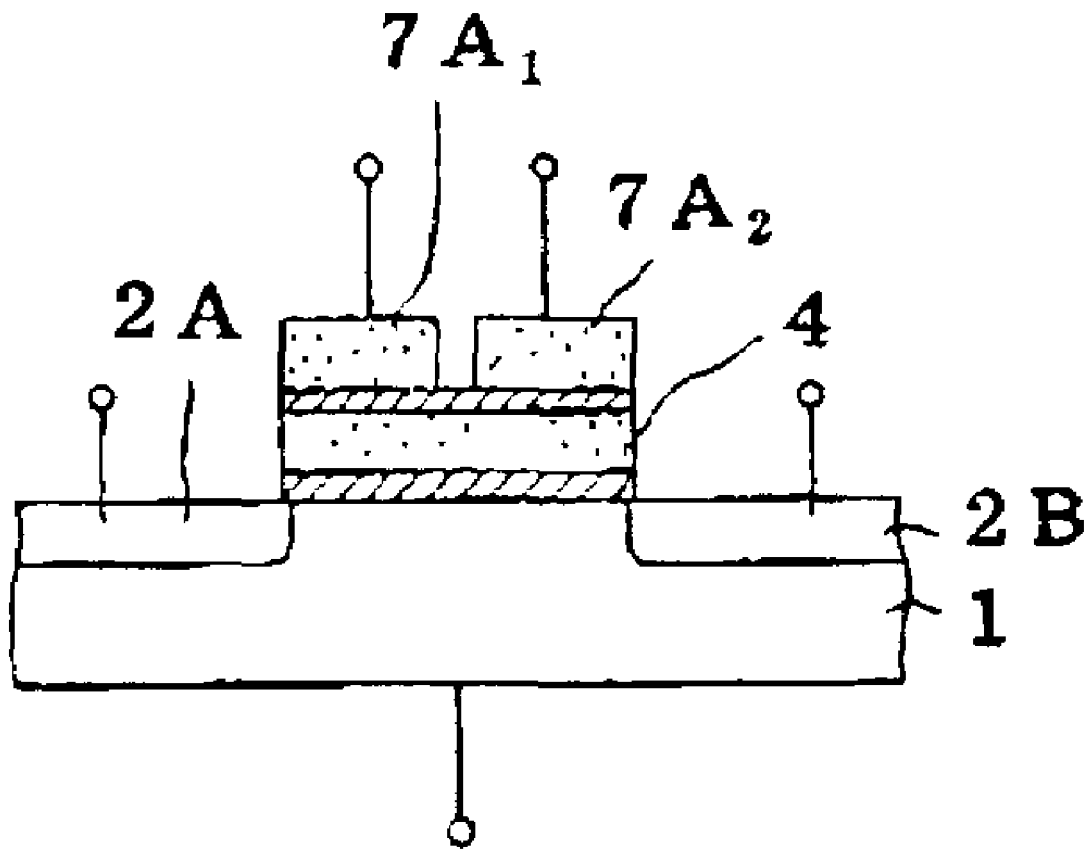
FIG. 3 is a schematic sectional view of a prior-art non-volatile semiconductor memory device.

The configuration of the nonvolatile semiconductor memory device of the present invention will be explained with reference to the fabricating methods thereof.

First, (a) a first insulating film and a first conductor film are stacked in this order on a semiconductor substrate followed by processing the first conductor film, and thereby a floating gate is formed.

For the semiconductor substrate, a silicon substrate is usually used. The semiconductor substrate may have P type or N type conductivity. The first insulating film that is formed on the semiconductor substrate is usually made of a silicon oxide film. When the substrate is a silicon substrate, the silicon oxide film can be formed by means of thermal oxidation method. Furthermore, this can be formed also by means of CVD method or sputtering method. The first insulating film works as a tunnel insulating film.

For the first conductor film, a film of silicon such as, for instance, poly-silicon, suicides and so on and a film of metal such as aluminum, copper and so on can be used. When the first conductor film is processed with a known method such as, for instance, wet or dry etching, it can be formed into a floating gate.

Next, (b) a second insulating film and a second conductor film are stacked in this order on the floating gate followed by processing the second conductor film, and thereby a first control gate is formed.

For the second insulating film, a silicon oxide film, a silicon nitride film and a stacked film thereof can be used. In addition, an ONO film made of silicon oxide film-silicon nitride film-silicon oxide film may be used. The method for forming the second insulating film is not restricted to a particular one. The thermal oxidation method, CVD method, sputtering method and so on can be cited.

For the second conductor film, a film based on silicon such as, for instance, polysilicon, suicides and so on and a film of metal such as aluminum, copper and so on can be used. The second conductor film can be formed into the first control gate by processing with a known method such as, for instance, wet or dry etching.

Next, (c) with the first control gate as a mask, an impurity is implanted on a surface layer of the semiconductor substrate, and thereby a drain diffusion region and a source diffusion region are formed. In the present invention, there is no need of, as in an existing ACT type nonvolatile semiconductor memory device, dividing the diffusion region in two regions of different impurity concentrations.

As the impurity being implanted, N type impurities such as phosphorus, arsenic and so on, and a P type impurity such as boron can be cited. The implanting conditions are different depending on the kind of the impurity being implanted.

Furthermore, the drain diffusion region and the source diffusion region may have a structure symmetrical to each other.

Next, (d) a third insulating film is formed on the first control gate and a sidewall thereof and on a sidewall of the floating gate.

For the third insulating film, a silicon oxide film, a silicon nitride film and a stacked film thereof can be used. In addition, an ONO film made of a silicon oxide film—a silicon nitride film—a silicon oxide film may be used. The method for forming the third insulating film is not restricted to a particular one, the CVD method, the sputtering method and so on can be cited.

Furthermore, (e) a third conductor film is stacked on the third insulating film followed by processing the third conductor film, and thereby a second control gate is formed on the first control gate with the third insulating film interposed therebetween.

For the third conductor film, a film based on silicon such as, for instance, polysilicon, suicides and so on, and a film of metal such as aluminum, copper and so on can be used. The third conductor film can be formed into the second control gate by processing with a known method such as, for instance, wet or dry etching.

When the third conductor film is processed into the second control gate, it is preferably carried out with a mask provided with a sidewall spacer. Thereby, a misalignment margin between an active region and the second control gate can be made wider.

With the aforementioned processes, a fundamental cell of the present invention can be formed.

In the aforementioned cell, it is preferable for the first control gate and the second control gate to be connected to a column decoder and a row decoder, respectively, and for the floating gate and the first and second control gates to be capacitively coupled.

In addition, a plurality of the cells may be disposed in a channel length direction and/or in a width direction. For instance, the channel length direction may have a plurality of the cells, and a source diffusion region of one cell and a drain diffusion region of other cell adjacent to the one cell in the channel length direction may be shared in common as one bit line. Alternatively, each of the channel length direction and the width direction may have a plurality of the cells, and the first control gates of a column of the cells continuous in the channel length direction or width direction may be shared in common as one first control gate line, and the second control gates of a row of the cells continuous in a direction vertical with respect to the first control gate line may be shared in common as one second control gate line.

When there is a plurality of the cells in the channel width direction, after the process (a) and before the process (b), a process for forming, by means of a shallow-trench isolation (STI) method, an element isolation region in the semiconductor substrate between the floating gates, and after the process (b) and before the process (c), a process for removing the element isolation region so that a source diffusion region and a drain diffusion region constituting the adjacent cells may be shared in common as one bit line may be preferably included.

The write operation of the nonvolatile semiconductor memory device of the present invention can be conducted by appropriately adjusting voltages supplied to the first control gate, the second control gate, the source diffusion region, the drain diffusion region and the substrate, and thereby injecting electrons from the substrate to the floating gate or from the floating gate to the substrate.

On the other hand, the erase operation can be performed by appropriately adjusting voltages supplied to the first control gate, the second control gate, the source diffusion region, the drain diffusion region and the substrate, when the write operation is performed by injecting electrons from the substrate to the floating gate, by injecting electrons from the floating gate to the substrate, or, when the write operation is performed by injecting electrons from the floating gate to the substrate, by injecting electrons from the substrate to the floating gate.

Furthermore, the read operation can be performed by appropriately adjusting voltages applied to the first control gate, the second control gate, the source diffusion region, the drain diffusion region and the substrate followed by determining whether an electric current flows in the cell or not.

The operation method including the above write operation, erase operation and read operation will be specifically explained in the following embodiments.

Embodiments

In the following, the present invention will be explained with reference to the drawings.

Figure 4:
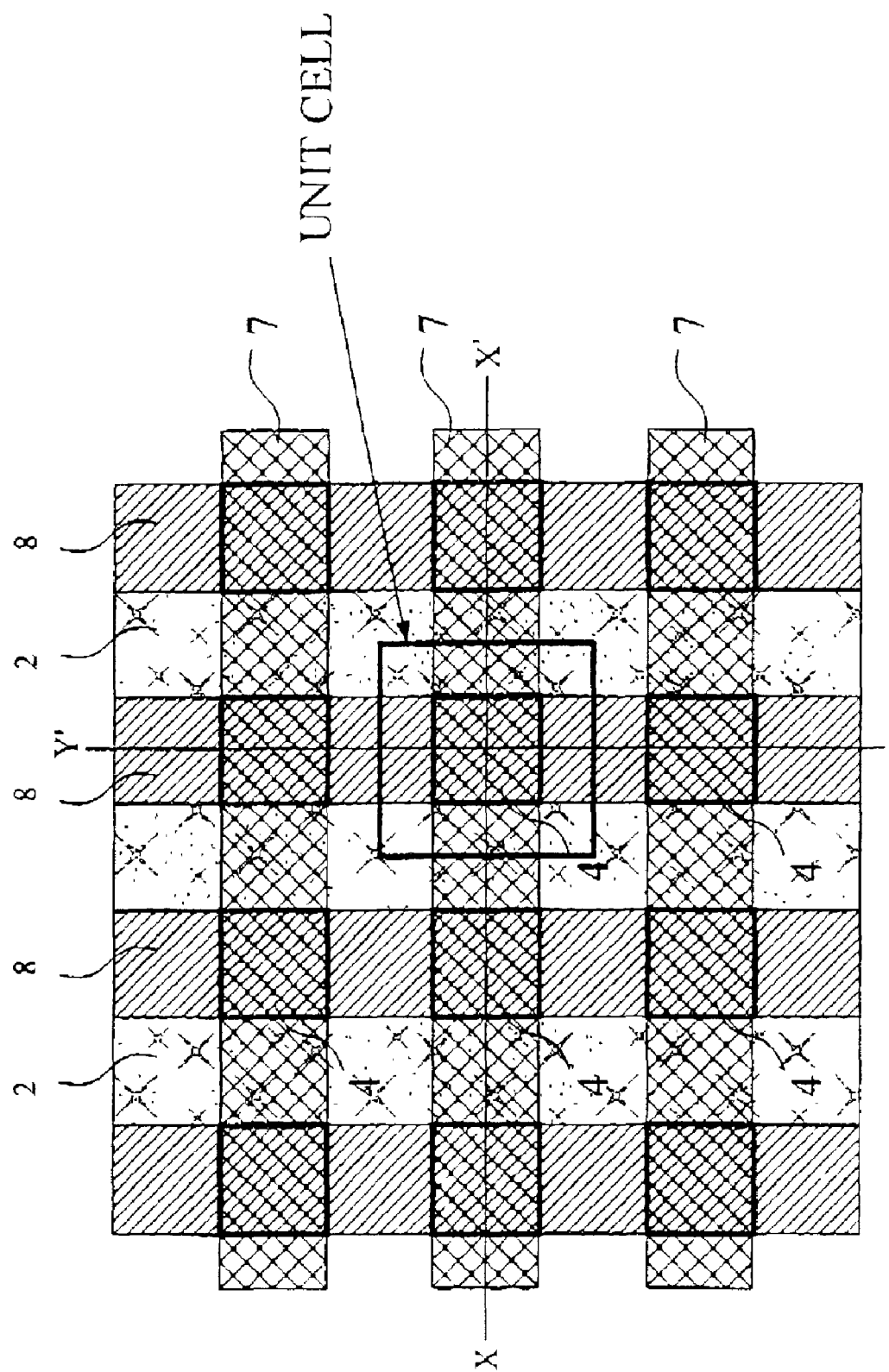
FIG. 4 is a schematic plan view of a non-volatile semiconductor memory device in accordance with the present invention.
Figure 6:
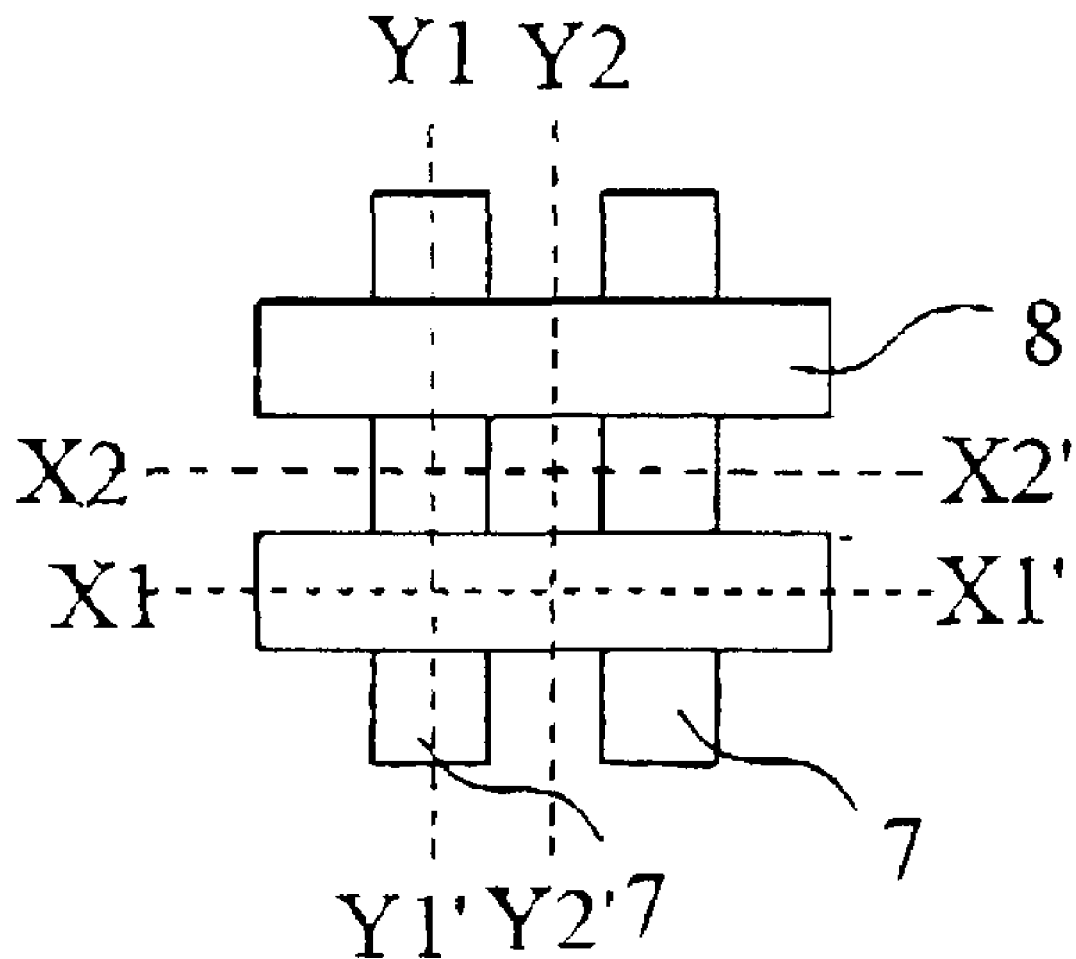
FIG. 6 is a schematic plan view of a non-volatile semiconductor memory device in accordance with the present invention.
Figure 7A:
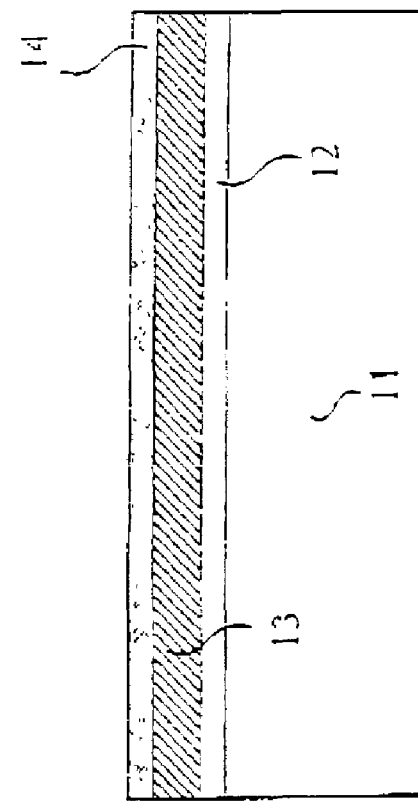
FIGS. 7(A) to 7(D) are schematic sectional views illustrating a production process of a non-volatile semiconductor memory device in accordance with the present invention.
Figure 7B:
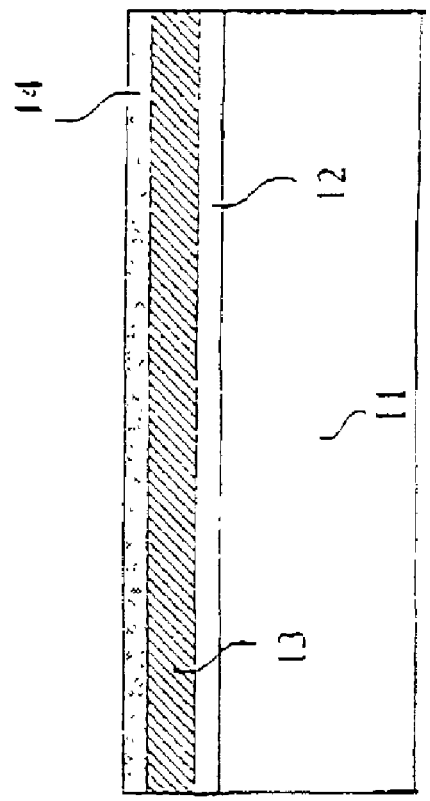
Figure 7C:
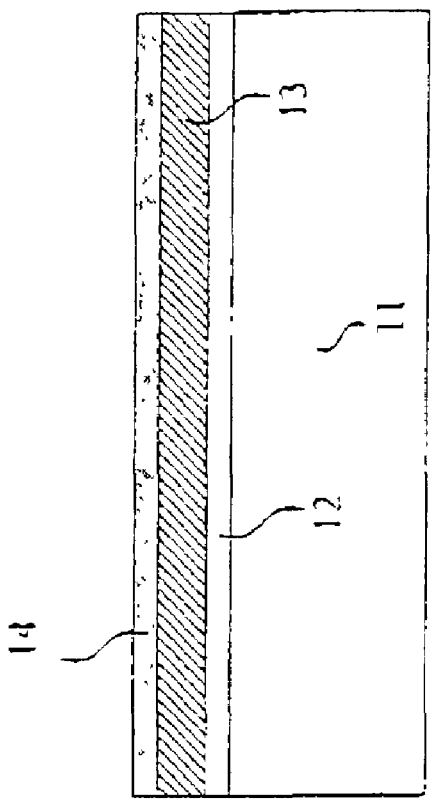
Figure 7D:
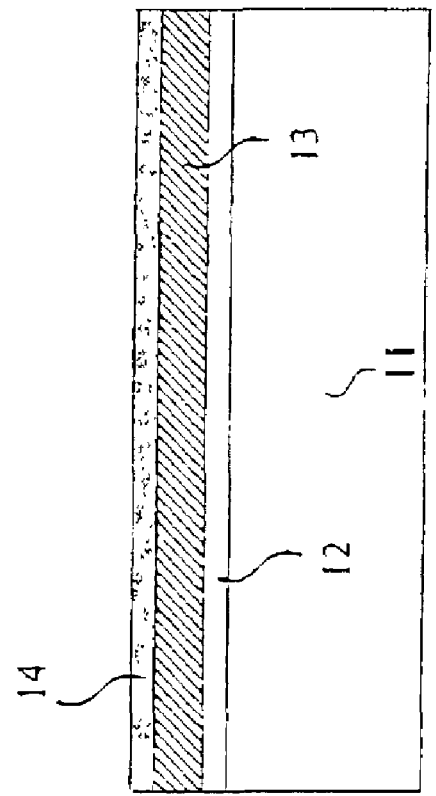
Figure 8A:
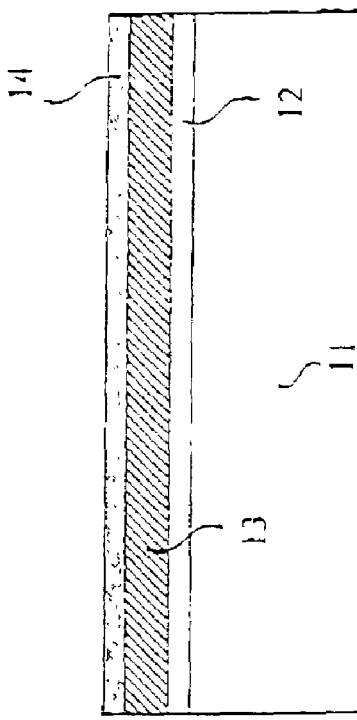
FIGS. 8(A) to 8(D) are schematic sectional views illustrating a production process of a non-volatile semiconductor memory device in accordance with the present invention.
Figure 8B:
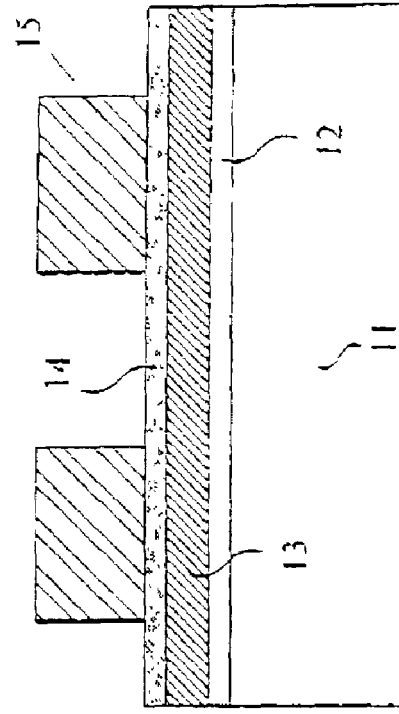
Figure 8C:
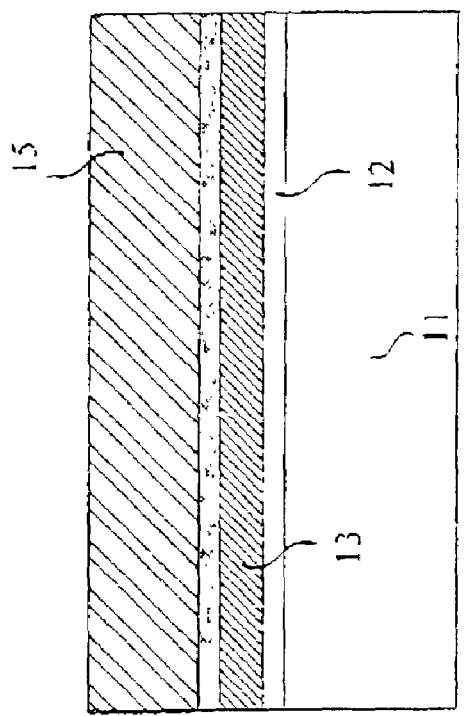
Figure 8D:
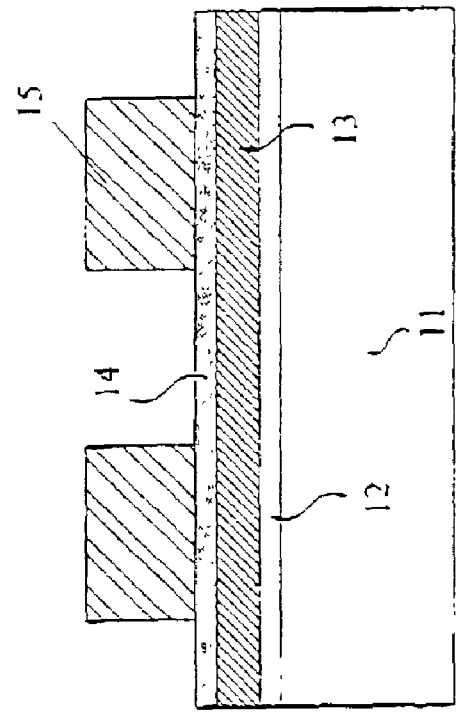
Figure 9A:
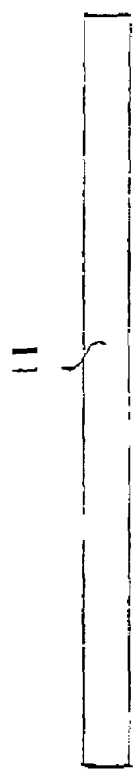
FIGS. 9(A) to 9(D) are schematic sectional views illustrating a production process of a non-volatile semiconductor memory device in accordance with the present invention.
Figure 9B:
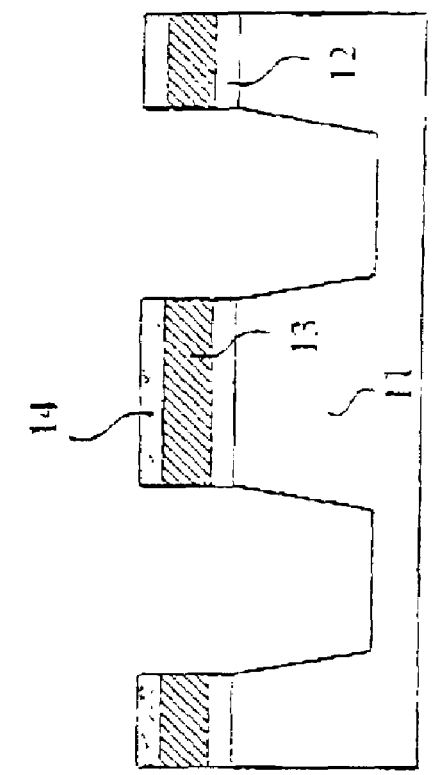
Figure 9C:
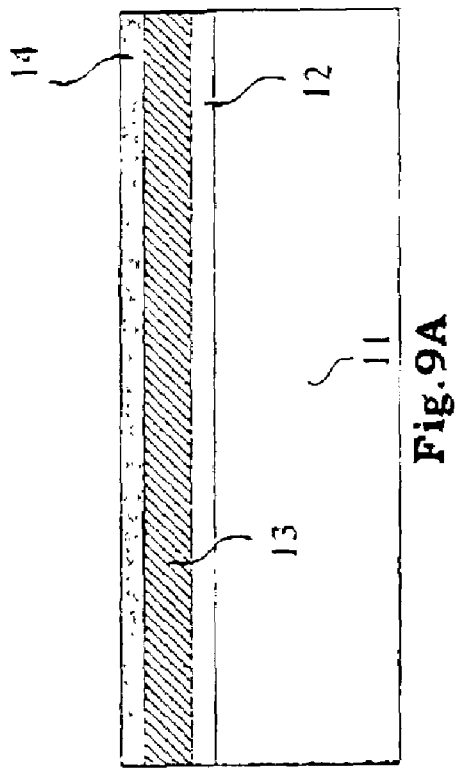
Figure 9D:
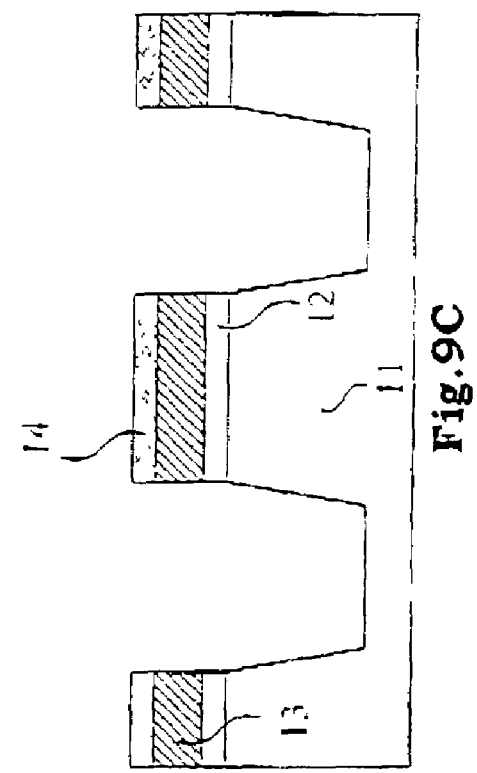
Figure 10A:
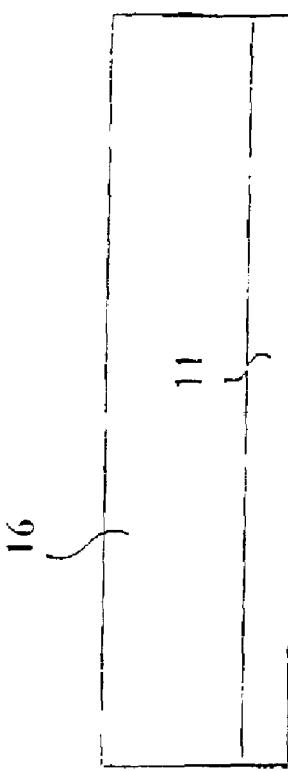
FIGS. 10(A) to 10(D) are schematic sectional views illustrating a production process of a non-volatile semiconductor memory device in accordance with the present invention.
Figure 10B:
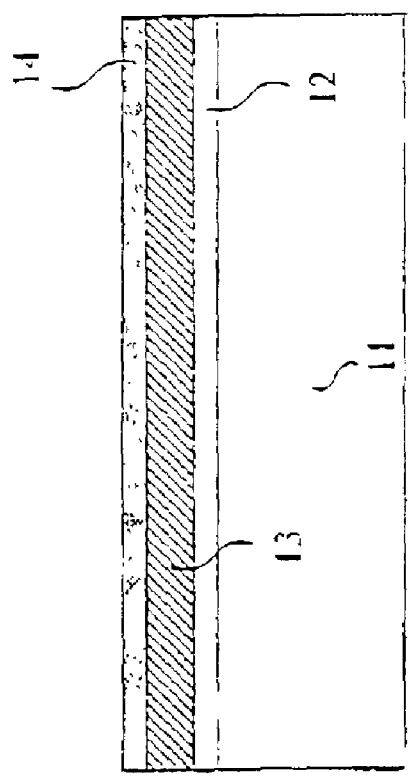
Figure 10C:
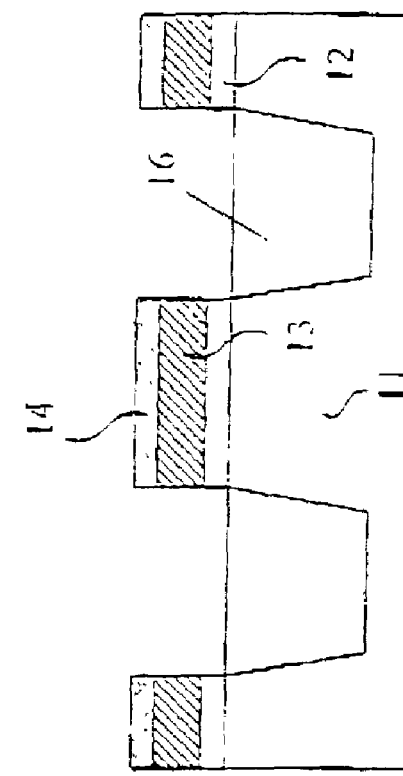
Figure 10D:
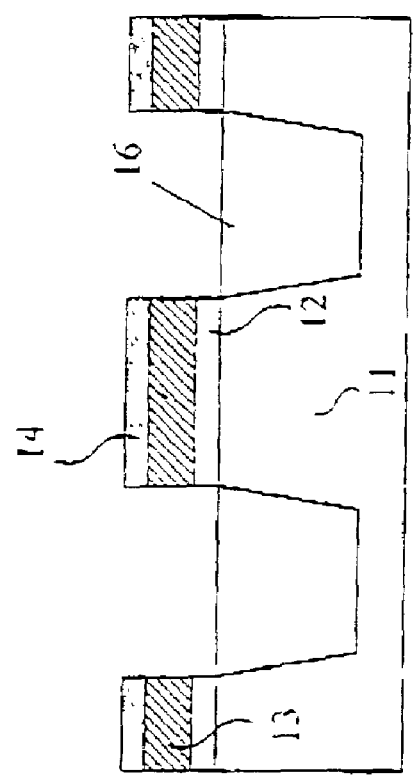
Figure 12A:
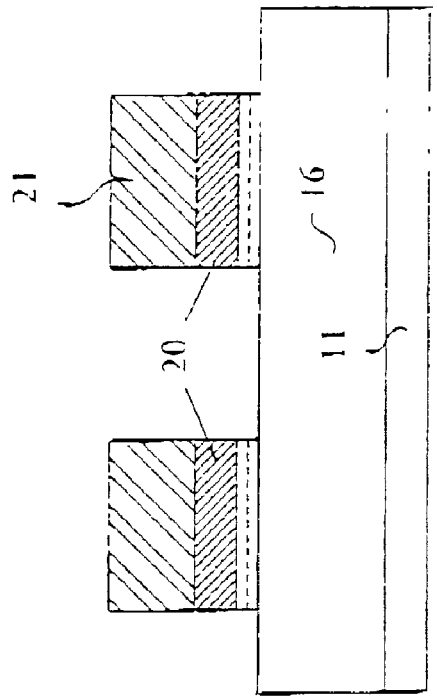
FIGS. 12(A) to 12(D) are schematic sectional views illustrating a production process of a non-volatile semiconductor memory device in accordance with the present invention.
Figure 12B:
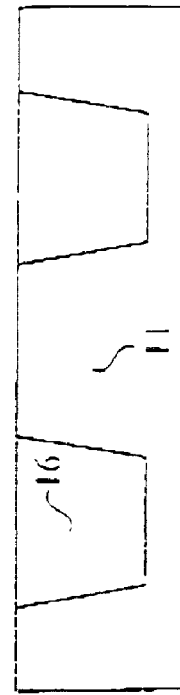
Figure 12C:
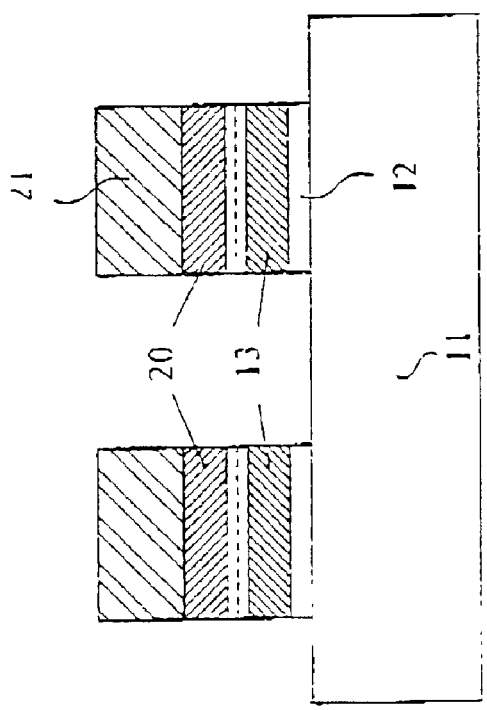
Figure 12D:
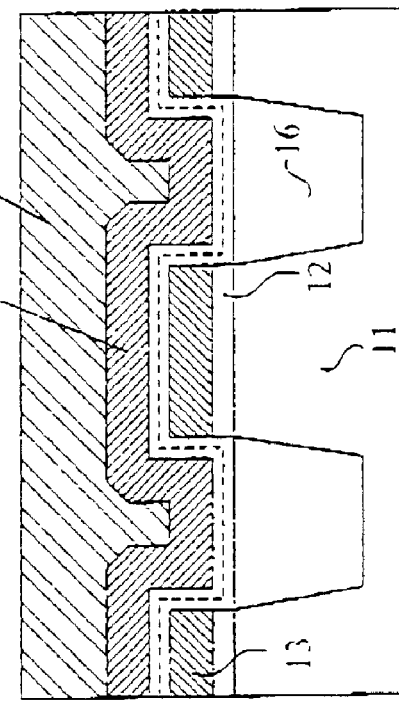
Figure 13A:
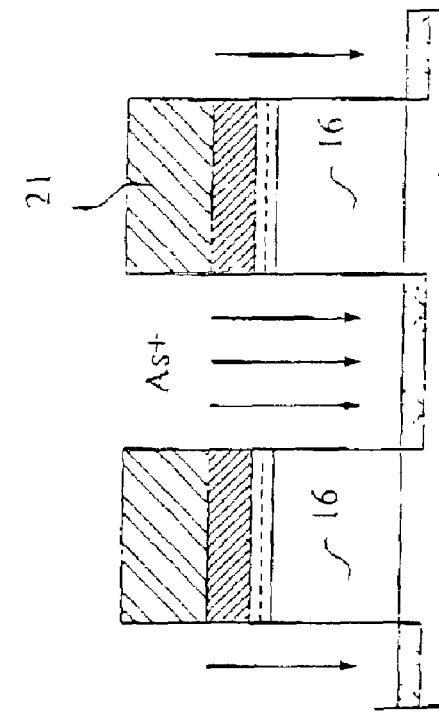
FIGS. 13(A) to 13(D) are schematic sectional views illustrating a production process of a non-volatile semiconductor memory device in accordance with the present invention.
Figure 13B:
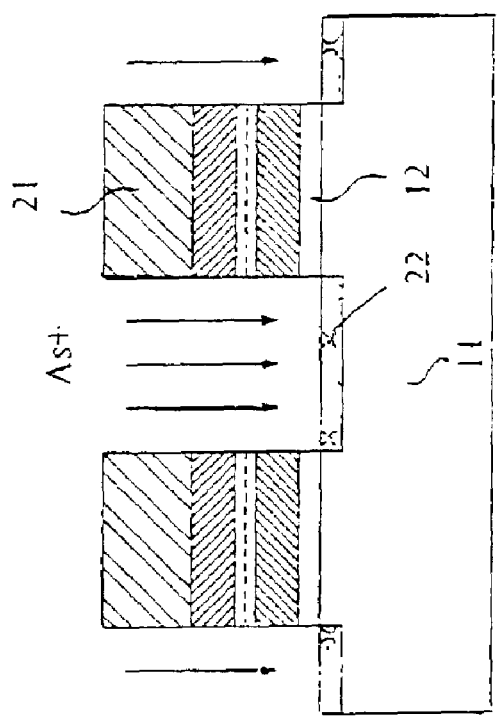
Figure 13C:
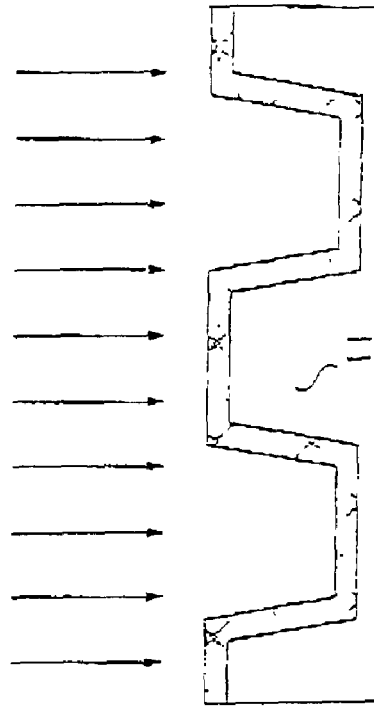
Figure 13D:
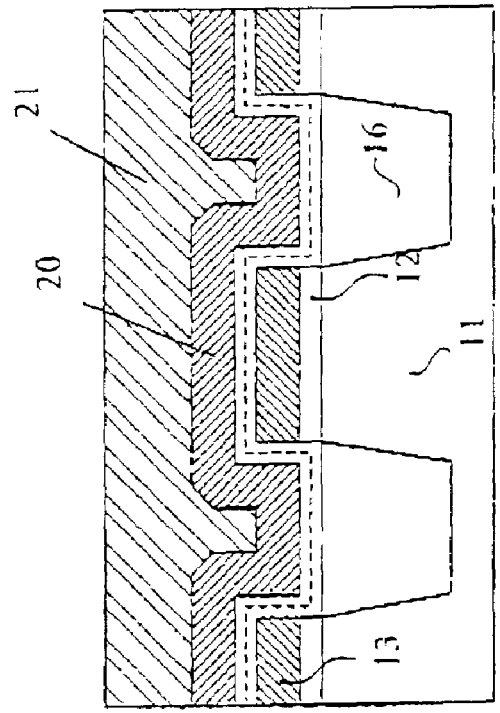
Figure 14A:
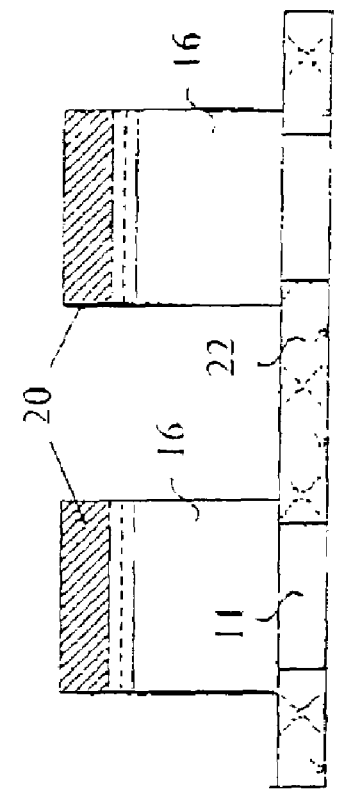
FIGS. 14(A) to 14(D) are schematic sectional views illustrating a production process of a non-volatile semiconductor memory device in accordance with the present invention.
Figure 14B:
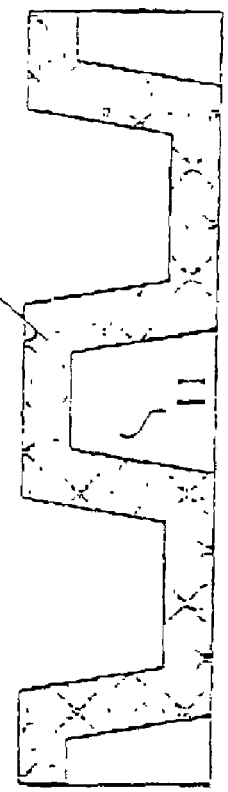
Figure 14C:
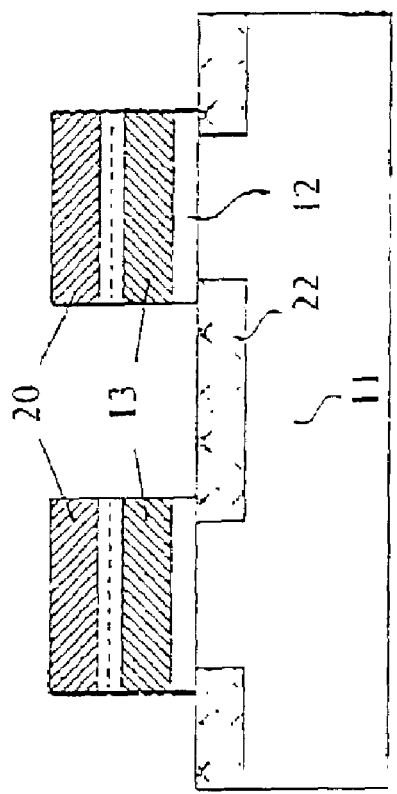
Figure 14D:
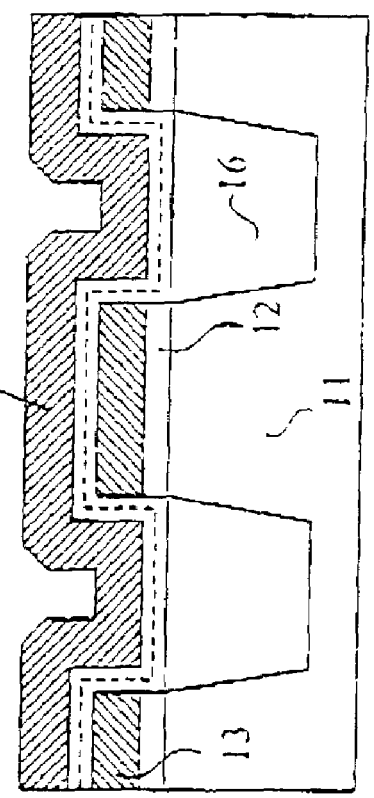
Figure 15A:
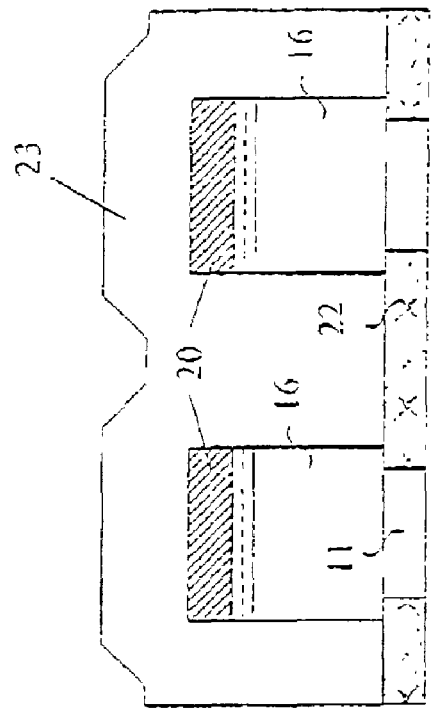
FIGS. 15(A) to 15(D) are schematic sectional views illustrating a production process of a non-volatile semiconductor memory device in accordance with the present invention.
Figure 15B:
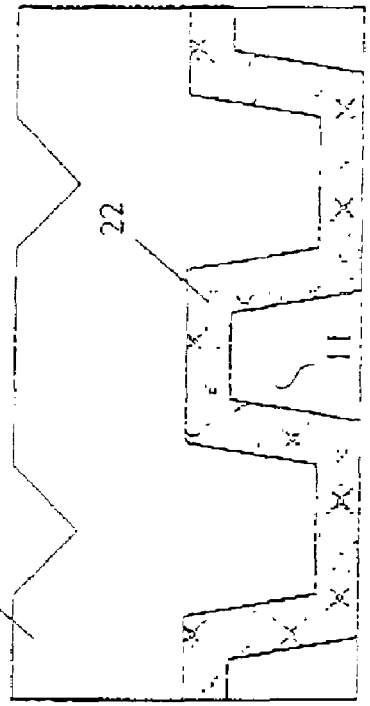
Figure 15C:
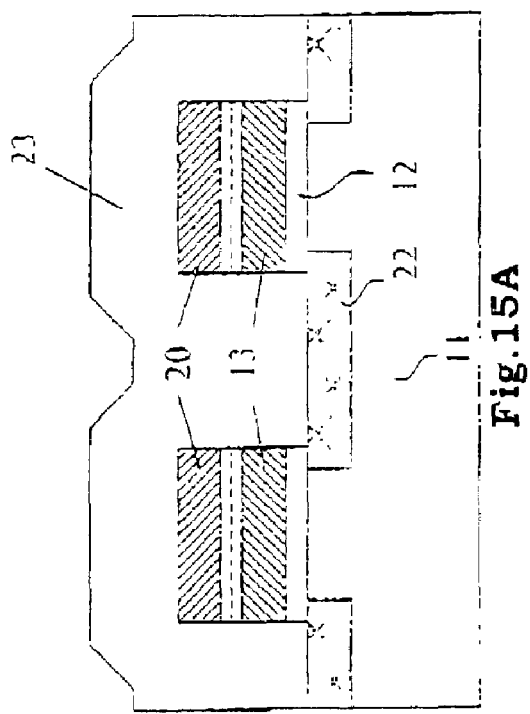
Figure 15D:
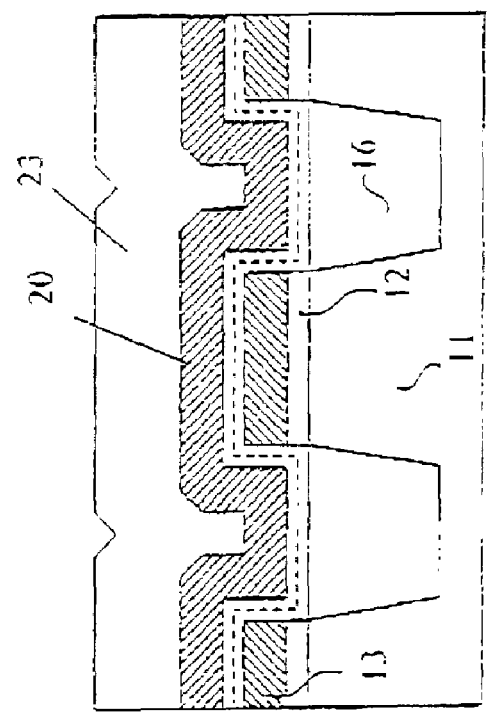
Figure 16B:
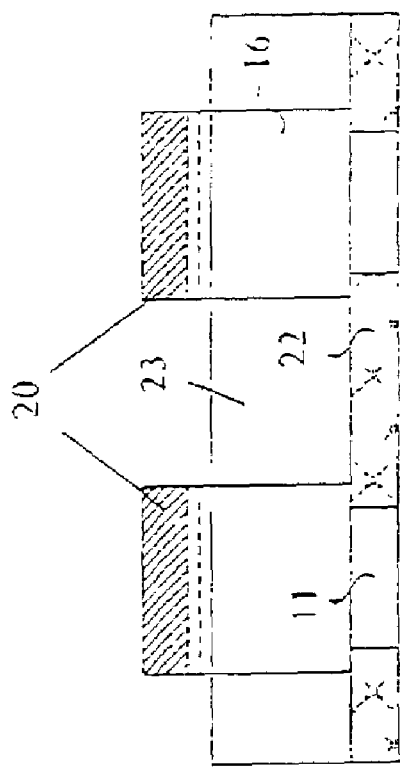
FIGS. 16(A) to 16(D) are schematic sectional views illustrating a production process of a non-volatile semiconductor memory device in accordance with the present invention.
Figure 16D:
Figure 16A:
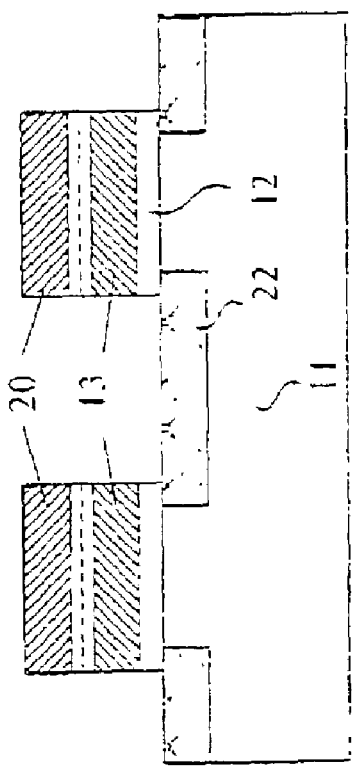
Figure 16C:
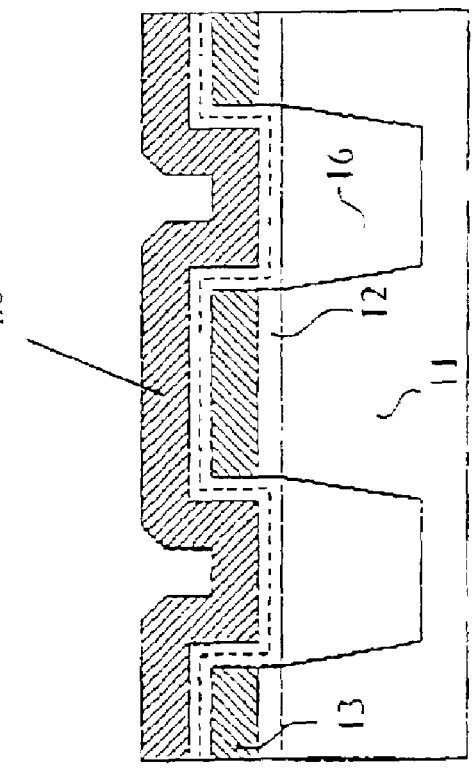
Figure 17A:
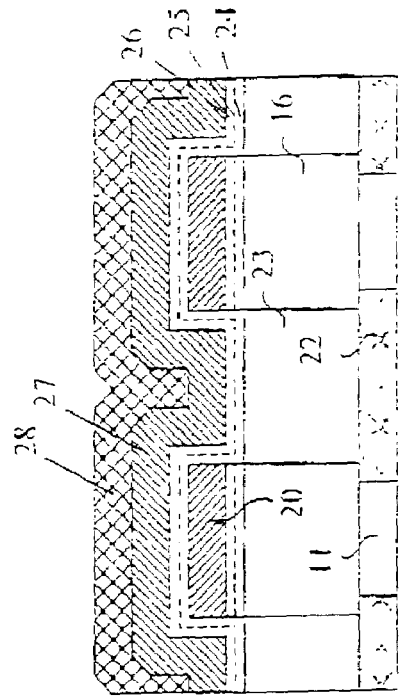
FIGS. 17(A) to 17(D) are schematic sectional views illustrating a production process of a non-volatile semiconductor memory device in accordance with the present invention.
Figure 17B:
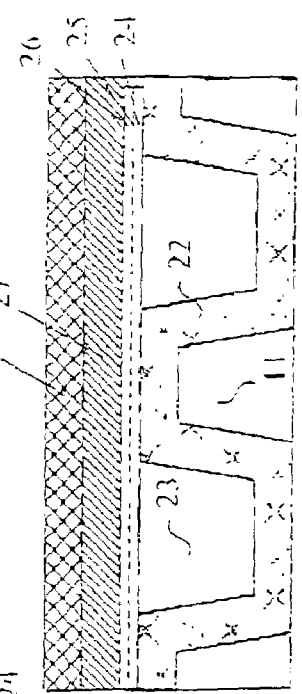
Figure 17C:
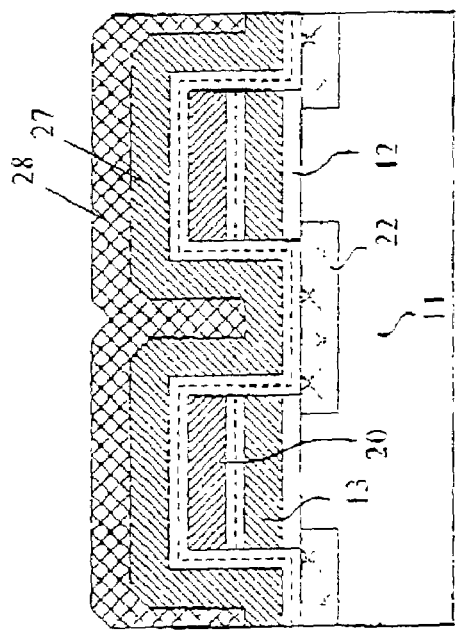
Figure 17D:
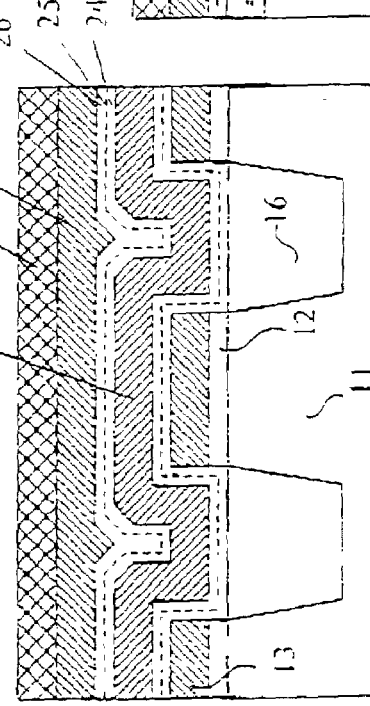
Figure 18A:
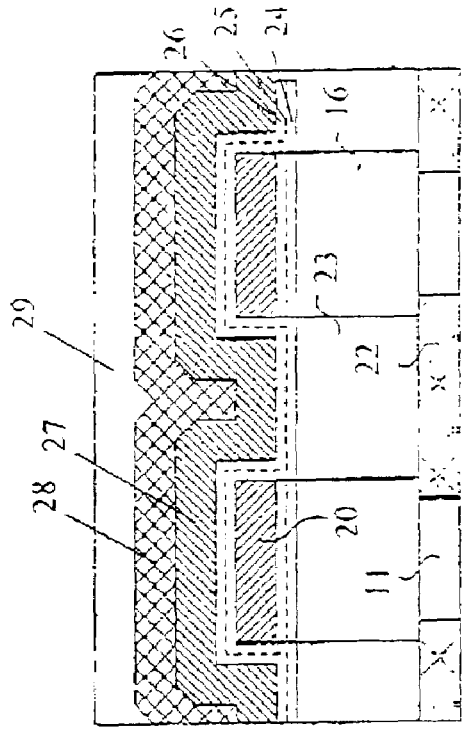
FIGS. 18(A) to 18(D) are schematic sectional views illustrating a production process of a non-volatile semiconductor memory device in accordance with the present invention.
Figure 18B:
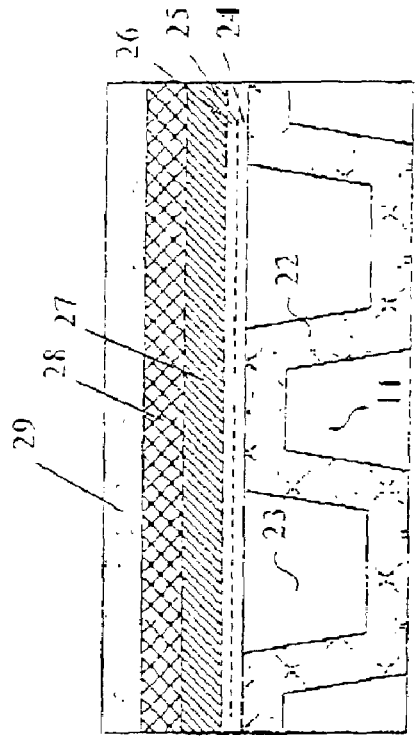
Figure 18C:
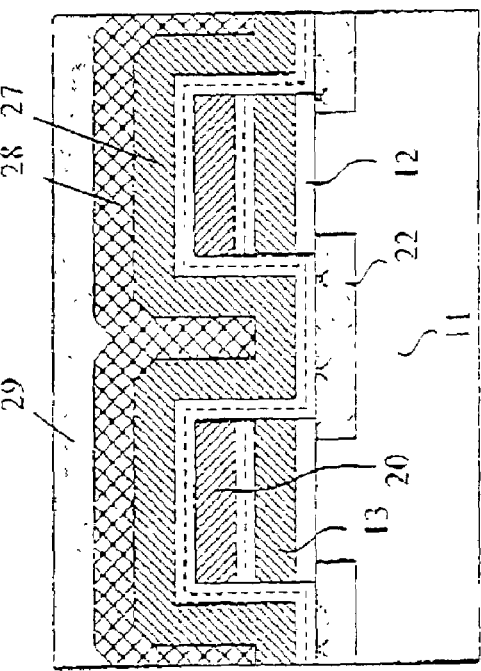
Figure 18D:
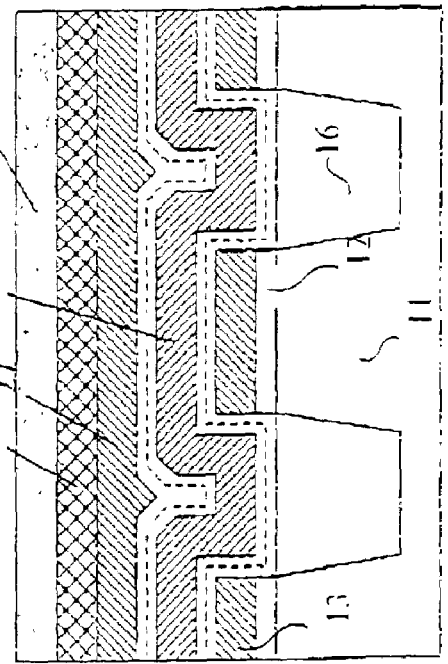
Figure 19A:
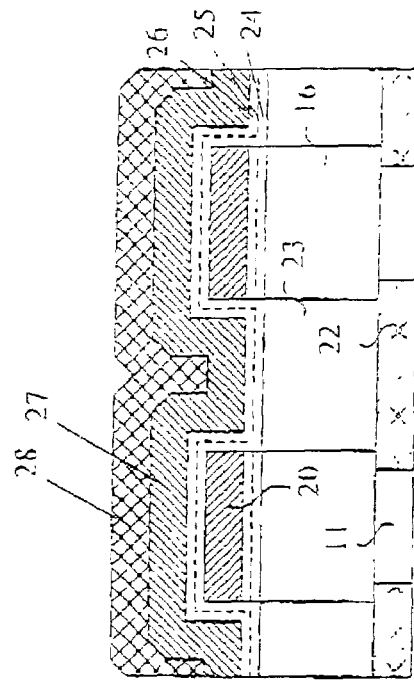
FIGS. 19(A) to 19(D) are schematic sectional views illustrating a production process of a non-volatile semiconductor memory device in accordance with the present invention.
Figure 19B:
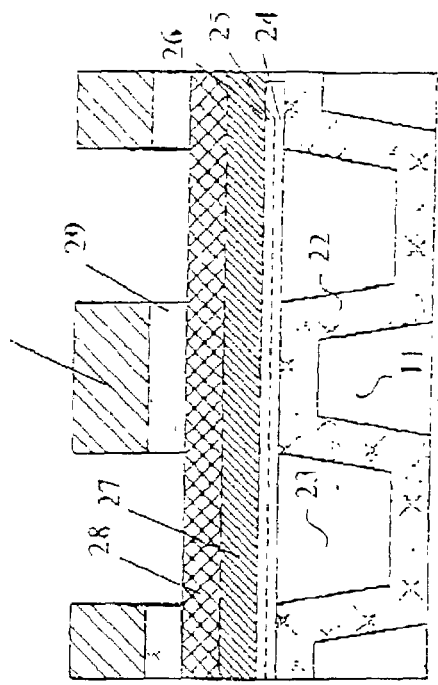
Figure 19C:
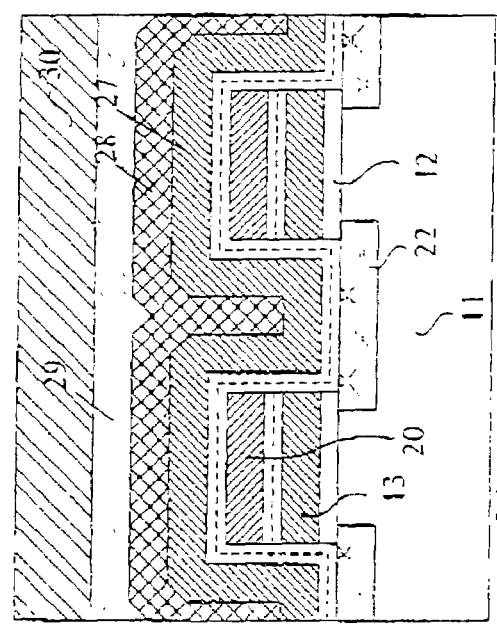
Figure 19D:
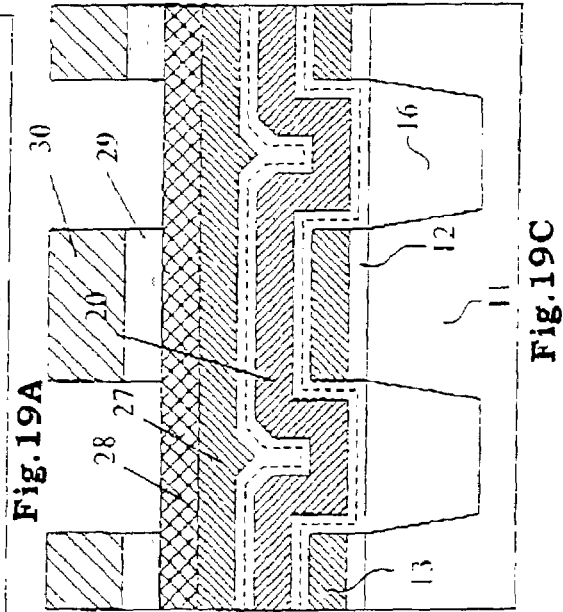
Figure 20A:
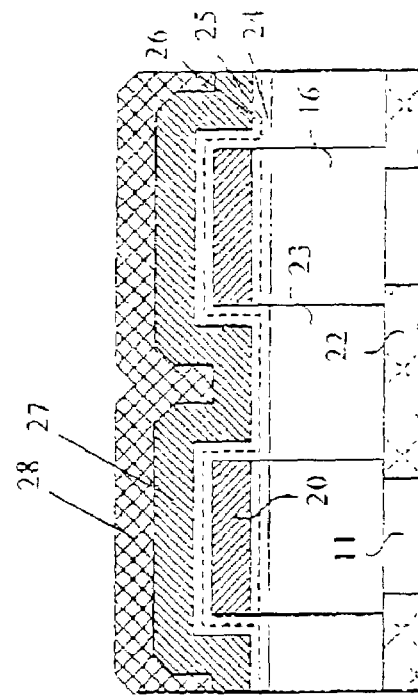
FIGS. 20(A) to 20(D) are schematic sectional views illustrating a production process of a non-volatile semiconductor memory device in accordance with the present invention.
Figure 20B:
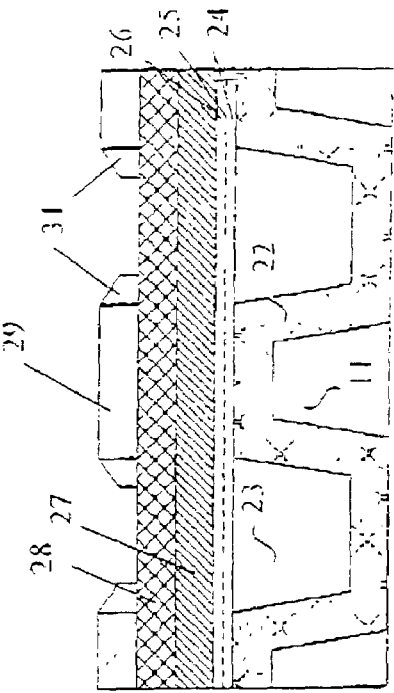
Figure 20C:
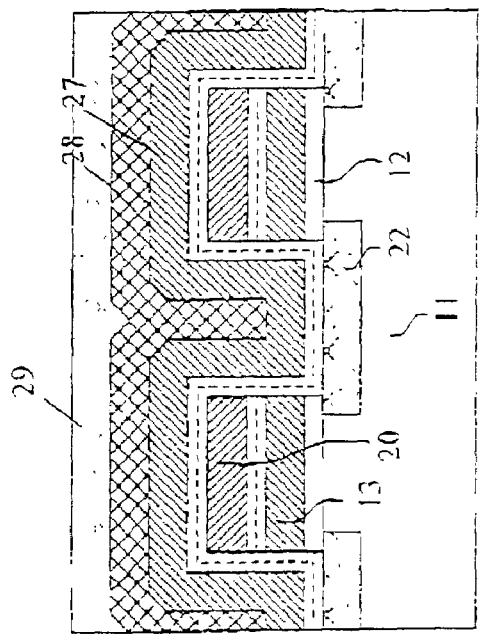
Figure 20D:
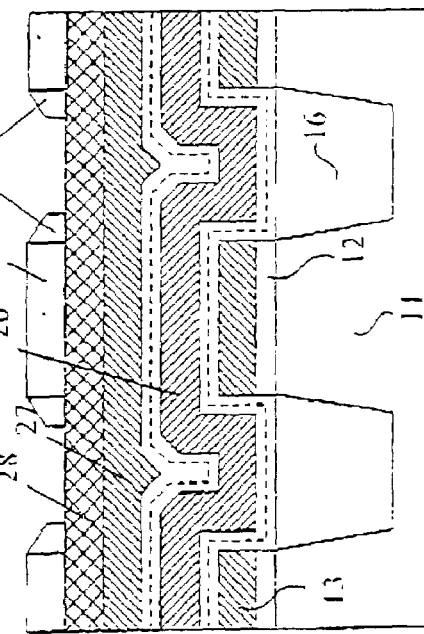
Figure 21B:
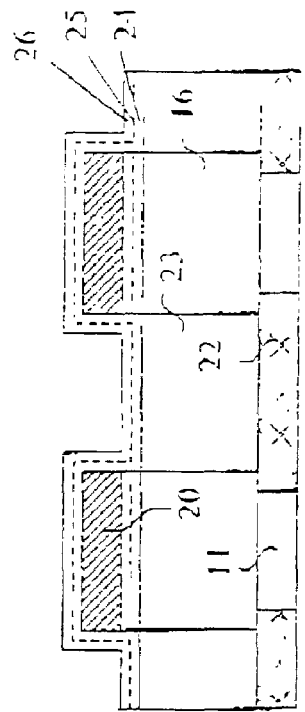
FIGS. 21(A) to 21(D) are schematic sectional views illustrating a production process of a non-volatile semiconductor memory device in accordance with the present invention.
Figure 21D:
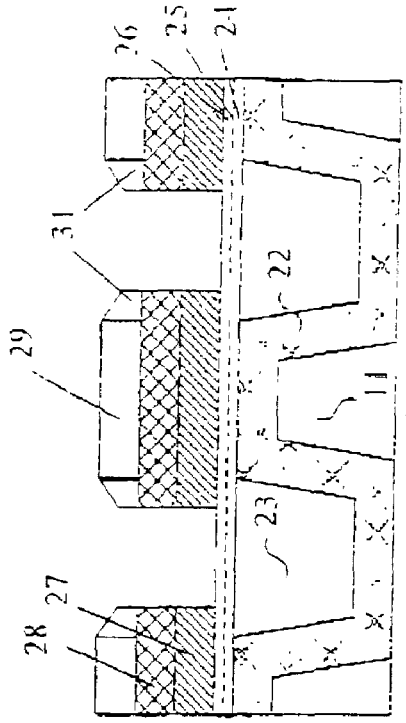
Figure 21A:
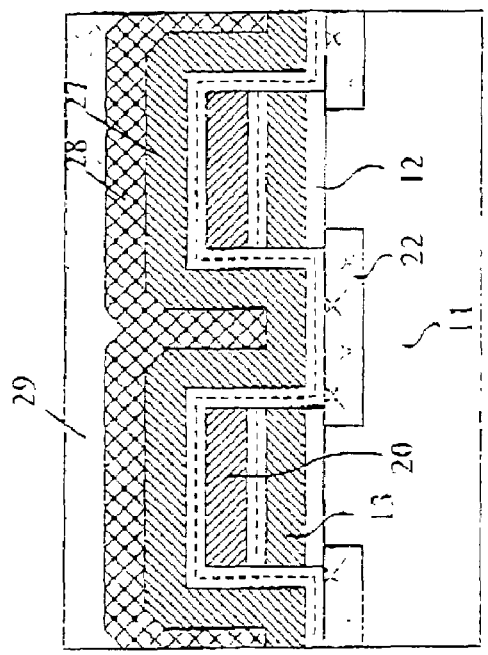
Figure 21C:
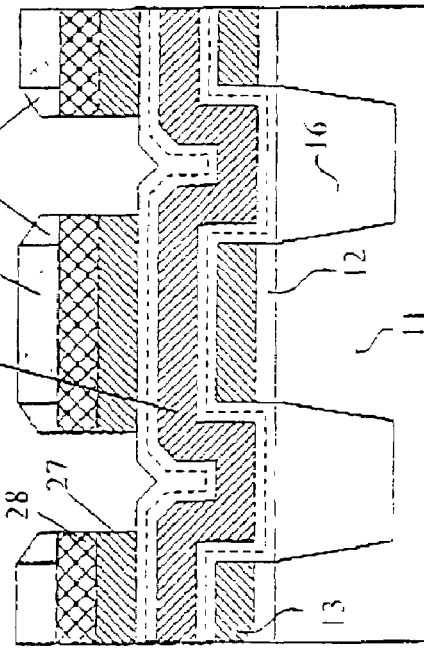
Figure 22A:
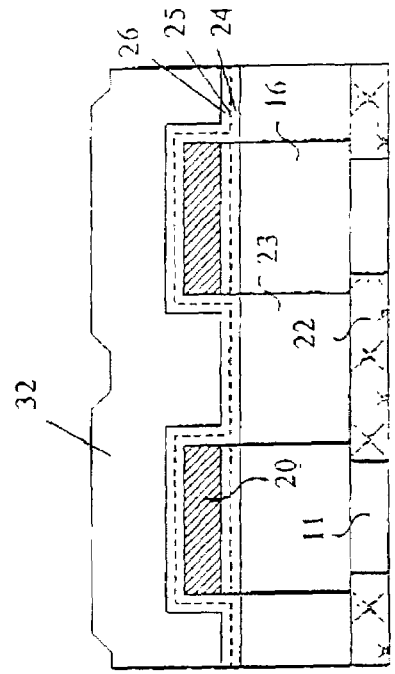
FIGS. 22(A) to 22(D) are schematic sectional views illustrating a production process of a non-volatile semiconductor memory device in accordance with the present invention.
Figure 22B:
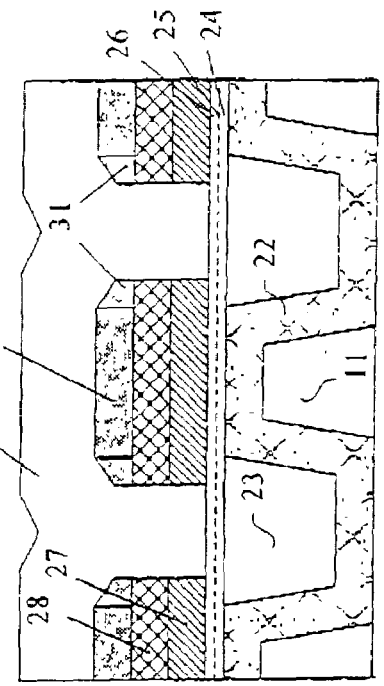
Figure 22C:
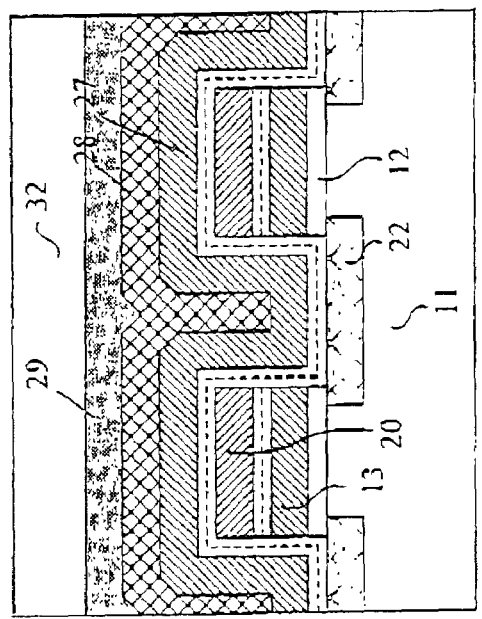
Figure 22D:
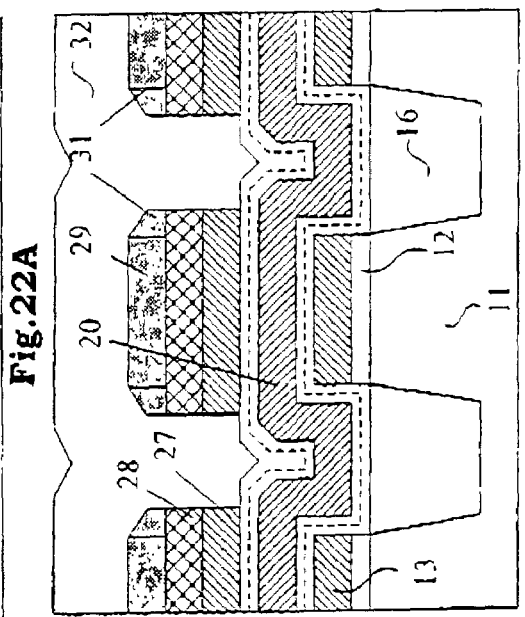

A layout diagram of one example of the nonvolatile semiconductor memory device of the present invention is shown in FIG. 4, an X–X' sectional view in a direction (X direction) along the first control gate connected to the column decoder is shown in FIG. 5A, and a Y–Y' sectional view in a direction (Y direction) along the second control gate connected to the row decoder is shown in FIG. 5B. In the figures, reference numeral 2 denotes an impurity diffusion region, reference numeral 4 the floating gate, reference numeral 5 a buried oxide film, reference numeral 6 the ONO stacked layer, reference numeral 7 the second control gate, reference numeral 8 the first control gate, and reference numeral 9 the silicon nitride film.

The method for fabricating the nonvolatile semiconductor memory device of the present invention will be explained with reference to FIG. 6, and FIG. 7A through FIG. 22A that are sectional views of a line portion in an X1–X1' direction, FIG. 7B through FIG. 22B that are sectional views of a space portion in an X2–X2' direction, FIG. 7C through FIG. 22C that are sectional views of a line portion in a Y1–Y1' direction, and FIG. 7D through FIG. 22D that are sectional views of a space portion in an Y2–Y2' direction.

In the following embodiments, a silicon substrate is used as the semiconductor substrate, a tunnel oxide film as the first insulating film, a first polysilicon layer as the floating gate, an ONO film as the second insulating film, a second polysilicon layer as the first control gate, an ONO film as the third insulating film, and a third polysilicon layer as the second control gate.

First, as shown in FIG. 7A through FIG. 7D, a silicon substrate 11 having a first conductivity type is thermally oxidized, and thereby a tunnel oxide film 12 having a film thickness of substantially 10 nm is formed. Thereafter, a first polysilicon layer 13 (film thickness: 50 nm) and a silicon nitride film 14 (film thickness: 250 nm) are sequentially deposited.

Next, as shown in FIG. 8A through FIG. 8D, a resist pattern 15 is formed by patterning by use of lithography technology.

Then, as shown in FIG. 9A through FIG. 9D, a composite layer of silicon nitride film 14/first polysilicon layer 13/tunnel oxide film 12/silicon substrate 11 is etched out so that an overall etched depth may be 275 nm, thereafter the resist pattern 15 is removed. In this process, as shown in sectional views in a Y–Y' direction of FIG. 9C and FIG. 9D, a groove is formed so as to form an STI region. The first polysilicon layer 13 runs in an X direction.

Next, as shown in FIG. 10A through FIG. 10D, a silicon oxide film 16 is buried in the groove followed by etching back to completely expose the first polysilicon layer 13. As shown in sectional views in a Y–Y' direction of FIG. 10C and FIG. 10D, a shallow trench isolation region is formed. Here, the silicon nitride film 14 is used to protect the floating gate.

Then, as shown in FIG. 11A through FIG. 11D, after the silicon nitride film 14 is removed, an ONO film made of a silicon oxide film 17 (film thickness: 4 to 5 nm), a silicon nitride film 18 (5 to 10 nm) and a silicon oxide film 19 (5 to 10 nm) is deposited. Thereafter, a second polysilicon layer 20 is deposited at a film thickness of substantially 50 nm.

Subsequently, as shown in FIG. 12A through FIG. 12D, a resist pattern 21 (CG) is formed by patterning by means of lithography technology. Thereafter, a composite layer of the second polysilicon layer 20/ONO film 19, 18, 17/first polysilicon layer 13/tunnel oxide film 12 is removed by etching. As shown in sectional views in an X–X' direction of FIG. 12A and FIG. 12B, the first control gate that runs in a Y direction.

Then, as shown in FIG. 13A through FIG. 13D, the buried silicon oxide film 16 in the shallow trench region is removed by etching, and As$^+$ion implantation is carried out under implantation conditions of 15 keV and 5E 14cm$^{-2}$. As shown in sectional views in a Y–Y' direction of FIG. 13C and FIG. 13D, the ion implantation is carried out so that diffusion layers may be joined together.

Then, as shown in FIG. 14A through FIG. 14D, after the removal of the resist pattern 21, in order to recover crystallinity in an implanted region and to activate an implanted impurity, an annealing process is carried out under 800° C. for 30 min. As shown in sectional views in a Y–Y' direction of FIG. 14C and FIG. 14D, a bit line 22 is formed.

Next, as shown in FIG. 15A through FIG. 15D, once more, in order to bury the shallow trench region, an HDP oxide film 23 is deposited at a thickness in the range of 500 to 800 nm. As shown in sectional views in a Y–Y' direction of FIG. 15C and FIG. 15D, the shallow trench region is buried.

Subsequently, as shown in FIG. 16A through FIG. 16D, the HDP oxide film 23 is etched back until the silicon substrate 11 is exposed and planarized.

Then, as shown in FIG. 17A through FIG. 17D, a silicon oxide film 24 (film thickness: 4 to 5 nm), a silicon nitride film 25 (5 to 10 nm) and a silicon oxide film 26 (5 to 10 nm) are stacked to form an ONO film. Thereafter, a third polysilicon layer 27 (150 nm) and a tungsten silicide film 28 (150 nm) are deposited.

Then, as shown in FIG. 18A through FIG. 18D, a silicon nitride film 29 is deposited to a film thickness of 10 to 20 nm.

Subsequently, as shown in FIG. 19A through FIG. 19D, after a resist pattern 30 is formed by patterning by use of lithography technology, the silicon nitride film 29 is removed by etching.

Then, as shown in FIG. 20A through FIG. 20D, after the resist pattern 30 is removed, a silicon nitride film 31 is deposited to a thickness in the range of from 5 to 10 nm and RIE (Reactive Ion Etching) is performed. As shown in sectional views in a Y–Y' direction of FIG. 20C and FIG. 20D, a sidewall spacer is formed. This is formed to make wider a misalignment margin between a second control gate line and an active region.

Next, as shown in FIG. 21A through FIG. 21D, by making use of the sidewall spacer 31, a composite layer of tungsten suicide film 28/third polysilicon layer 27 is removed by etching. As shown in sectional views in a Y–Y' direction of FIG. 21C and FIG. 21D, a second control gate is formed.

Then, as shown in FIG. 22A through FIG. 22D, finally, a BPSG (Boron Phosphorus Silicate Glass) protective film 32 is deposited to a film thickness of substantially 1000 nm.

Thereafter, according to the ordinary procedure, contact holes are formed, aluminum electrodes and so on are formed, and thereby a nonvolatile semiconductor memory device of the present invention is provided.

Figure 23:
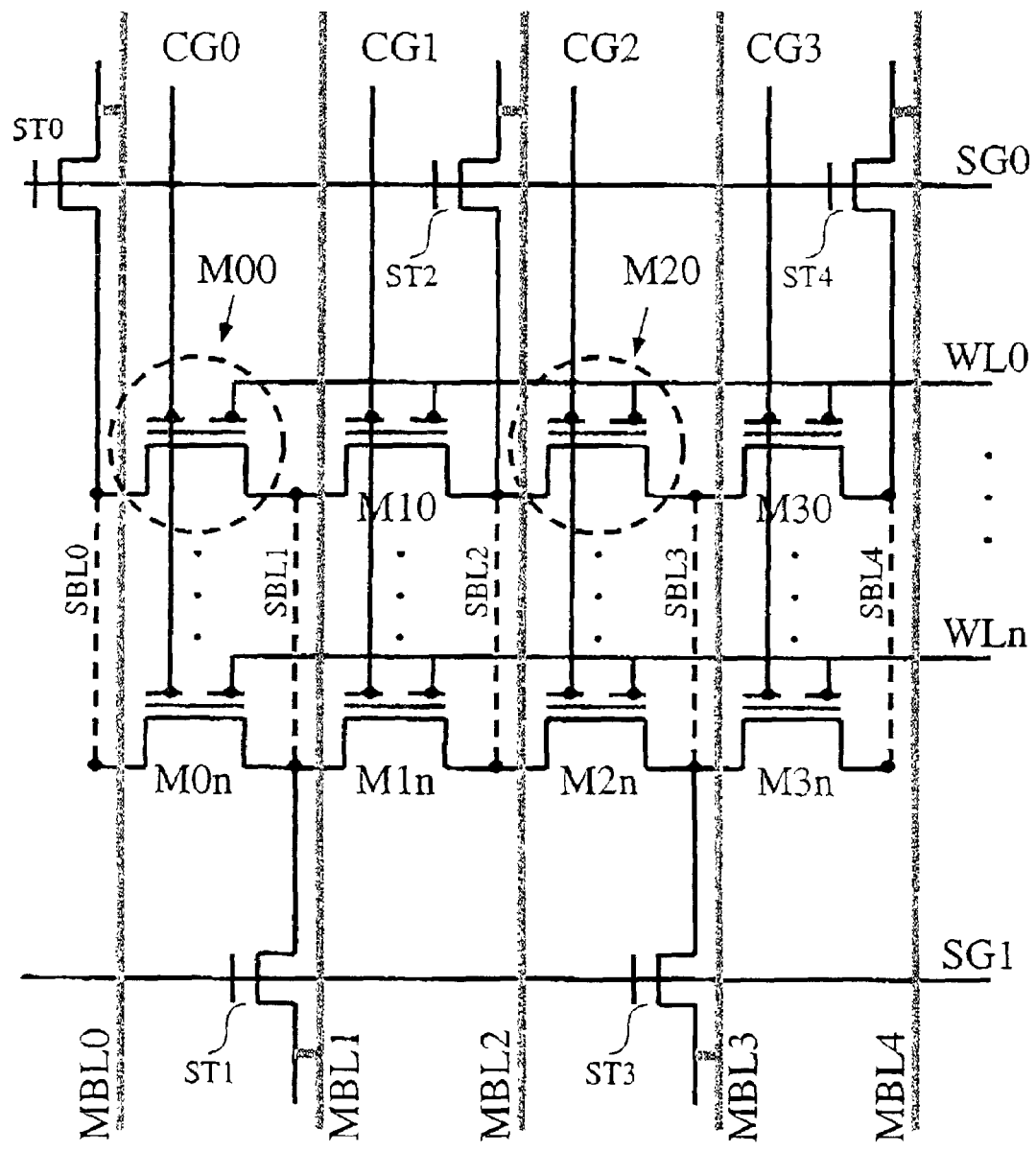
FIG. 23 is an equivalent circuit diagram of a non-volatile semiconductor memory device in accordance with the present invention.

One example of the writing method, erasing method and reading method of the nonvolatile semiconductor memory device of the present invention will be explained with reference to FIG. 23. Operation voltage conditions are shown in Table 1. Here, the first control gate is called a control gate (CG) and the second control gate is called a word line (WL) In the following, in the write and erase operations, the channel FN phenomenon is utilized. The channel FN phenomenon means a phenomenon in which electrons are exchanged between the floating gate and the substrate.

A voltage of −15 V is supplied to each of a control gate 2 (CG2) and a word line 0 (WL0). To each of non-selected control gates and non-selected word lines and main bit lines 0 to 4 (MBL0 to MBL4), 0 V or 0 V floating is supplied, and to each of the substrate and selected gates 0 and 1 (SG0 and SG1), 0 V is supplied. At this time, because of the capacitive coupling, the floating gate is supplied with −10 V or more (−10.0 V at GCR (Gate Coupling Ratio)=0.66). As a result, a high voltage is applied to a tunnel oxide film between the floating gate and the silicon substrate, and owing to the FN tunnel phenomenon, electrons are ejected from the floating gate into the silicon substrate, resulting in lowering a threshold voltage of the selected cell (M20) to a write state in the range of 1 to 2 V.

Non-selected cells (M00, 10, 30 and 2n in FIG. 23) connected to the selected control gate and word line, since a potential (−5.0 V at GCR=0.6) of only −10 V or less is supplied to the floating gate, does not cause the electron ejection due to the FN tunnel phenomenon. Accordingly, the write operation can be performed only on the selected cell at an intersection of the selected control gate and the selected word line (Pgm1 in Table 1).

Furthermore, the write operation can be conducted while supplying a positive voltage of +5 V to the substrate at the time of writing. At this time, since the selected control gate voltage and the selected word line voltage become −10 V, an input write voltage can be lowered (Pgm2 in Table 1). To each of the non-selected control gates and the non-selected word lines, 0 V or 0 V floating is supplied, and to the main bit lines 0 to 4 (MBL0 to 4) and the selected gates 0 and 1 (SGO0 and 1), +5 V and +5 V, or 0 V floating and 0 V are supplied, respectively.

<Channel FN Erase>

The erase operation here means to inject electrons from the substrate into the floating gate, and thereby raising the

TABLE 1

|  | Pgm1 | Pgm2 | Ers1 | Ers2 | Ers3 | Ers4 | Ers5 | Ers6 | Read1 | Read2 |
|---|---|---|---|---|---|---|---|---|---|---|
| CG0 | 0 V/F | 0 V/F | +15 V | +10 V | +30 V | +15 V | 0 V/F | 0 V/F | 0 V | 0 V |
| CG1 | 0 V/F | 0 V/F | +15 V | +10 V | +30 V | +15 V | 0 V/F | 0 V/F | 0 V | 0 V |
| CG2 | −15 V | −10 V | +15 V | +10 V | +30 V | +15 V | 0 V/F | 0 V/F | +3 V | 0 V |
| CG3 | 0 V/F | 0 V/F | +15 V | +10 V | +30 V | +15 V | 0 V/F | 0 V/F | 0 V | 0 V |
| WL0 | −15 V | −10 V | +15 V | +10 V | 0 V/F | 0 V/F | +30 V | +15 V | +3 V | +6 V |
| WLn | 0 V/F | 0 V/F | +15 V | +10 V | 0 V/F | 0 V/F | +30 V | +15 V | 0 V | 0 V |
| MBL0 | 0 V/F | +5 V/F | 0 V/F | −5 V/F | 0 V/F | −8 V/F | 0 V/F | −8 V/F | +1 V | +1 V |
| MBL1 | 0 V/F | +5 V/F | 0 V/F | −5 V/F | 0 V/F | −8 V/F | 0 V/F | −8 V/F | 0 V | +1 V |
| MBL2 | 0 V/F | +5 V/F | 0 V/F | −5 V/F | 0 V/F | −8 V/F | 0 V/F | −8 V/F | +1 V | +1 V |
| MBL3 | 0 V/F | +5 V/F | 0 V/F | −5 V/F | 0 V/F | −8 V/F | 0 V/F | −8 V/F | 0 V | 0 V |
| MBL4 | 0 V/F | +5 V/F | 0 V/F | −5 V/F | 0 V/F | −8 V/F | 0 V/F | −8 V/F | +1 V | 0 V |
| Sub | 0 V | +5 V | 0 V | −5 V | 0 V | −8 V | 0 V | −8 V | 0 V | 0 V |
| SG0 | 0 V | +5/0 V | 0 V | 0 V/−5 V | 0 V | 0 V/−8 V | 0 V | 0 V/−8 V | +3 V | +3 V |
| SG1 | 0 V | +5/0 V | 0 V | 0 V/−5 V | 0 V | 0 V/−8 V | 0 V | 0 V/−8 V | +3 V | +3 V |

(F = 0 V floating)

<Channel FN Write Operation>

Cells in a block are in an erase state, that is, all threshold voltages distribute in the range of 4 V or more. Accordingly, in the write operation, only in a cell selected to write, electrons are selectively ejected from the floating gate and thereby lowering the threshold voltage thereof to in the range of 1 V to 2 V. In FIG. 23, a case where a memory cell 20 (M20) is written will be considered.

threshold voltage to 4 V or more. In FIG. 23, we consider a case where the erase operation is applied to cells M00, 10, 20, 30, 0n, 1n, 2n and 3n.

To each of the control gates (CG0 to 4), +15 V is supplied, and to each of the word lines (WL0 to n), +15 V is supplied. To the main bit lines (MBL0 to 4), 0 V or 0 V floating is supplied, and to each of the substrate and the floating gate (SG0 and 1), 0 V is supplied. At this time, because of the capacitive coupling, the floating gate is supplied with +10 V or more (+10.0 V at GCR=0.66). As a result, a high voltage is applied to the tunnel oxide film between the floating gate and the silicon substrate, owing to the FN tunnel phenomenon, electrons are injected from the silicon substrate to the floating gate, thereby the threshold voltage of the cell is raised to the erase state of 4 V or more (Ers1 in Table 1).

The erase method can be conducted on each bit as the smallest erase range.

Furthermore, at the time of erasing, the erase operation can be conducted while supplying a negative voltage of −5 V to the substrate. At this time, the selected control gate voltage and the selected word line voltage become +10 V, thus the input erase voltage can be lowered. To the main bit lines 0 to 4 (MBL0 to 4) and the selected gates 0 and 1 (SG0 and 1), −5 V and 0 V, or 0 V floating and −5V are supplied, respectively (Ers2 in Table 1).

Furthermore, to each of the control gates (CG0 to 4), +30 V is supplied. To each of the word lines (WL0 to n) and main bit lines (MBL0 to 4), 0 V or 0 V floating is supplied, and to each of the substrate and the selected gates (SG0 and 1), 0 V is supplied. At this time, because of the capacitive coupling, the floating gate is supplied with +10 V (+10.0 V at GCR=0.66). As a result, a high voltage is applied to the tunnel oxide film between the floating gate and the silicon substrate, owing to the FN tunnel phenomenon, electrons are injected from the silicon substrate to the floating gate, thereby the threshold voltage of the cell is raised to the erase state of 4 V or more (Ers3 in Table 1).

The erase method can be applied on each control gate line as the smallest erase range.

Furthermore, at the time of erasing, the erase operation can be conducted while supplying a negative voltage of −8 V to the substrate In this time, since the selected control gate voltage becomes +15 V, the input erase voltage can be lowered (Ers4 in Table 1). To each of the word lines, 0 V or 0 V floating is supplied, and to the main bit lines 0 to 4 (MBL0 to MBL4) and the selected gates 0 and 1 (SG0 and SG1), −8 V and 0 V, or 0 V floating and −8 V are supplied, respectively.

Still furthermore, to each of the word lines (WL0 to WLn), +30 V is supplied. To each of the control gates (CG0 to CG4) and the main bit lines (MBL0 to MBL4), 0 V or 0 V floating is supplied, and to each of the substrate and the selected gates (SG0 and SG1), 0 V is supplied. At this time, because of the capacitive coupling, the floating gate is supplied with +10 V (+10 V at GCR=0.66). As a result, a high voltage is applied to the tunnel oxide film between the floating gate and the silicon substrate, owing to the FN tunnel phenomenon, electrons are injected from the silicon substrate to the floating gate, resulting in raising the threshold voltage of the cell to the erase state of 4 V or more (Ers5 in Table 1).

This erase method can be applied on each word line as the minimum erase range.

Furthermore, at the time of erasing, the erase operation can be conducted while supplying a negative voltage of −8 V to the substrate. In this case, since the selected word line voltage becomes +15 V, the input erase voltage can be lowered (Ers6 in Table 1). To each of the control gates, 0 V or 0 V floating is supplied, and to each of the main bit lines 0 to 4 (MBL0 to MBL4) and the selected gates 0 and 1 (SG0 and SG1), −8 V and 0 V, or 0 V floating and −8 V are supplied, respectively.

As understands from the aforementioned rewrite methods (write and erase operation) of the nonvolatile semiconductor memory device of the present invention, either of the electron injection and the electron ejection can select a bit. That is, in the present invention, although the write operation is based on the electron ejection from the substrate to the floating gate and the erase operation is based on the electron injection from the substrate to the floating gate, the erase operation may be based on the electron ejection and the write operation may be based on the electron injection.

<Read>

Next, we consider a case where the cells M00 and M20 are simultaneously read. To each of the main bit lines MBL1 and 3,0 V is supplied, to each of the main bit lines MBL0, MBL2 and MBL4, 1V is supplied, to each of the control gates 0 and 2 (CG0 and CG2), +3 V is supplied, and a voltage of the word line 0 (WL0) is set at +3 V. Whether the selected cells (M00 and M20) are in write state or erase state is determined on the basis whether an electric current flows in the cell or not, that is, whether or not the potentials of the MBL0, MBL2 and MBL4 are lowered from 1 V to 0 V.

Furthermore, each of the main bit lines MBL1, MBL2 and MBL3 is supplied with 1 V floating, each of the main bit lines MBL3 and MBL4 is supplied with 0 V, and a voltage of the word line 0 (WL0) is set at +6 V. In this state, whether the selected cell (M20) is in a write state or an erase state is determined on the basis whether or not an electric current flows in the cell (Read2 in Table 1).

Figure 24A:
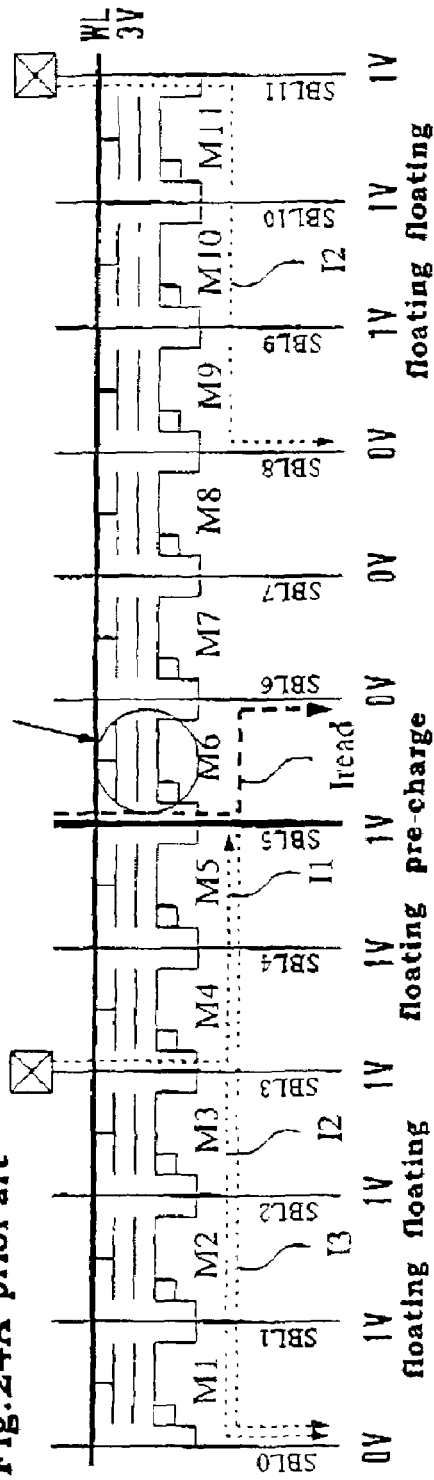
FIGS. 24(A) and 24(B) illustrate an operating method for a non-volatile semiconductor memory.
Figure 24B:
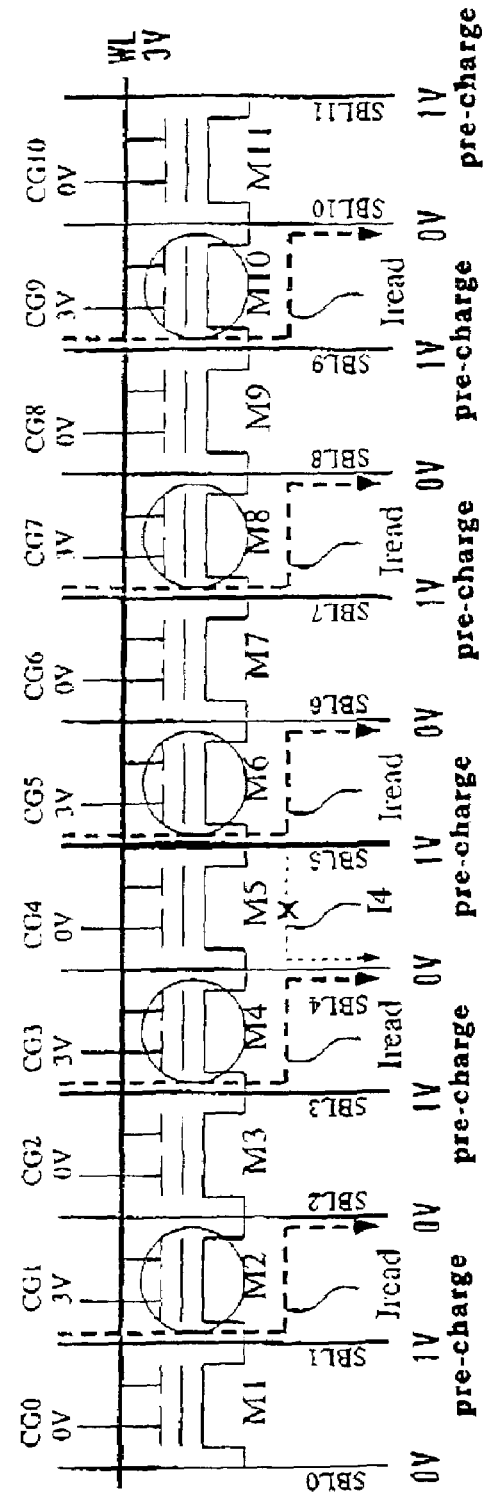

In FIG. 24A, an eight cycle read operation in the existing virtual ground array is shown, and in FIG. 24B, a two cycle read operation of the present invention is shown.

In the existing operation, when a selected cell is read, a word line is pre-charged to +3 V and a selected bit line (SBL5) is pre-charged to +1 V (off when it becomes +1 V), and SBL0 and SBL6 to SBL8 are set at 0 V, SBL1, SBL2, SBL4, SBL9 and SBL10 are set at 1 V floating, and SBL3 and SBL11 are set at 1 V, and a read current (Iread) that flows from the selected bit line SBL5 to SBL6 is determined, and thereby the read operation is performed. In the existing virtual ground array structure, since a bit line is shared with an adjacent cell, when a threshold voltage of non-selected cells (M1 to M5) is 3 V or less, since the non-selected cells become an on-state, an electric current flows between adjacent cells in a transversal direction. Accordingly, in order to inhibit a leakage current from flowing in a transversal direction, an eight cycle read operation in which cells on a word line is read divided in eight times is adopted, in addition, in order to inhibit a leakage current from flowing (dotted line 13 in the figure) from a selected bit line 1 V (SBL5) to a GND line (SBL0) on a reverse side, a bit line (SBL3) of 1 V force is inserted between the selected bit line 1 V (SBL5) and the GND line (SBL0) on the reverse side. In this case, the non-selected cells (M1 through M5 and M9 through M11), when these are in the write state and the threshold voltage is low, become on-state owing to the word line voltage, an electric current flows from the bit lines (SBL3) of 1 V force (1 V is always applied during the reading) to the selected bit line 1 V (SBL5) (dotted arrow mark 11 in the figure), or an electric current flows from the bit lines (SBL3, SBL11) of 1 V force to a GND of common source lines (SBL0, SBL8) (dotted arrow mark 12 in the figure), the common source lines may be set in the floating state, thereby a read cell current may be influenced by other non-selected cells, resulting in deterioration of read accuracy.

On the other hand, in the read operation of the present invention (FIG. 24B), two of the selected first control gates (CG1, 3, 5, 7, and 9) and the selected second control gate (word line (WL)) are supplied with 3 V, and the selected cells (M2, M4, M6, M8, and M10) are simultaneously read.

From the relationship of the capacitive coupling, the non-selected cells (M1, M3, M5, M7, M9 and M11) are supplied with a voltage of only substantially 1.5 V. However, even when the non-selected cells are in the write state and the threshold voltage thereof is low, the leakage current in a transversal direction is greatly reduced and a two cycle read operation in which the cells on a word line are read divided in two times is realized. Accordingly, read accuracy can be improved and multi-value storage is made easier from the former, and read speed is improved from the latter.

When a floating Date voltage of one memory cell is controlled by a control gate voltage and a word line voltage, owing to the channel FN phenomenon, the write and erase operations can be conducted. Accordingly, since there is no need of an asymmetric source and drain structure, miniaturization can be easily accomplished. By use of a single source and drain, a cell area 4F2 can be realized.

By conducting the write and erase operations due to the channel FN phenomenon, since an inter-band tunnel current is inhibited from occurring, reliability is improved Accordingly, high-speed write operation and high reliability can be realized.

At the time of reading, by controlling the floating gate voltage by means of two control gates, a transversal direction leakage current can be suppressed, accordingly, accuracy in the read characteristics can be improved. Accordingly, multi-value storage is made easier, and a cell area of 2F2 (4 value) or less can be realized Furthermore, the number of times of reading the cells connected to one second control gate can be reduced from the existing eight cycles to two cycle, resulting in shortening a read time.

When a floating gate voltage of one memory cell is controlled by use of a control gate voltage and a word line voltage, rewrite operation can be conducted for each bit. That is, write operation can be conducted on a lower threshold voltage side. This allows overcoming existing disadvantages in that since the existing NOR type channel FN rewritable flash memory can write only on a higher threshold voltage side, a threshold value distribution on a no verify erase side is broad, accordingly, a read voltage is high. Accordingly, power consumption in the read operation can be reduced.

What is claimed is:

1. A nonvolatile semiconductor memory device comprising a first cell which includes:
   a drain diffusion region and a source diffusion region formed on a surface layer of a semiconductor substrate;
   a first insulating film formed on the surface layer between the source diffusion region and the drain diffusion region;
   a floating gate formed on the first insulating film;
   a second insulating film formed on the floating gate;
   a first control gate formed on the second insulating film;
   a third insulating film formed on the first control gate and a sidewall thereof and on a sidewall of the floating gate;
   a second control gate formed on the first control gate with the third insulating film interposed therebetween;
   means for writing into the cell by causing electrons to be ejected from the floating gate into the substrate so as to lower a threshold voltage of the cell;
   a plurality of such cells are provided in a channel length direction, wherein a source diffusion region of the first cell and a drain diffusion region of a second cell adjacent to said first cell in the channel length direction are shared in common as one bit line; and
   wherein the second control gate is also formed on (a) the sidewall of the first control gate with the third insulating film interposed therebetween, on (b) the sidewall of the floating gate with the third insulating film interposed therebetween, and on (c) the source and drain diffusion regions with the third insulating film interposed therebetween, in the channel length direction.

2. A nonvolatile semiconductor memory device comprising an array of memory cells, the memory device comprising:
   a first memory cell including a drain diffusion region and a source diffusion region formed on a surface layer of a semiconductor substrate;
   a first insulating film formed on the surface layer between the source diffusion region and the drain diffusion region of the first memory cell;
   a floating gate for at least the first memory cell formed on the first insulating film;
   a second insulating film formed on the floating gate;
   a first control gate for at least the first memory cell formed on the second insulating film;
   a third insulating film formed on the first control gate and a sidewall thereof and on a sidewall of the floating gate;
   a second control gate for at least the first memory cell formed on the first control gate with the third insulating film interposed therebetween;
   a second memory cell adjacent to the first memory cell;
   wherein the drain diffusion region of the first memory cell also functions as a source diffusion region of the second memory cell so that the drain diffusion region of the first memory cell and the source diffusion region of the second memory cell are shared as one bit line, and wherein the source and drain diffusion regions of the first memory cell are symmetrically located with respect to the floating gate of the first memory cell in that the source and drain diffusion regions of the first memory cell are both of approximately the same size and are both located approximately the same distance from the floating gate of the first memory cell; and
   wherein the second control gate is also formed on (a) the sidewall of the first control gate with the third insulating film interposed therebetween, on (b) the sidewall of the floating gate with the third insulating film interposed therebetween, and on (c) the source and drain diffusion regions with the third insulating film interposed therebetween, in the channel length direction.

3. A nonvolatile semiconductor memory device comprising a first memory cell, a second memory cell and a third memory cell arranged in a channel length direction, wherein each of these memory cells comprise:
   a drain diffusion region and a source diffusion region formed on a surface layer of a semiconductor substrate;
   a first insulating film formed on the surface layer between the source diffusion region and the drain diffusion region;
   a floating gate formed on the first insulating film;
   a second insulating film formed on the floating gate;
   a first control gate formed on the second insulating film;
   a third insulating film formed on the first control gate and a sidewall thereof and on a sidewall of the floating gate;
   a second control gate formed on the first control gate with the third insulating film interposed therebetween;
   wherein the floating gate has first and second opposite edges, the first edge of the floating gate being aligned above an edge area of the drain diffusion region, and the second edge of the floating gate being aligned above an edge area of the source diffusion region;
   said first, second and third memory cells are arranged in the channel length direction, and wherein a source diffusion region of the first cell and a drain diffusion region of the second cell adjacent to said first cell are shared in common as one bit line; and a source diffusion region of the second cell and a drain diffusion region of the third cell adjacent to the second cell are shared in common as one bit line; and wherein the second control gate is also formed on (a) the sidewall of the first control gate with the third insulating film interposed therebetween, on (b) the sidewall of the floating gate with the third insulating film interposed therebetween, and on (c) the source and drain diffusion regions with the third insulating film interposed therebetween, in the channel length direction.

4. A nonvolatile semiconductor memory device according to claim 3, wherein the first control gate and the second control gate are electrically connected to a column decoder and a row decoder, respectively, and the floating gate is capacitively coupled to the first control gate and the second control gate.

5. A nonvolatile semiconductor memory device according to claim 3, wherein the drain diffusion region and the source diffusion region have structures symmetric to each other.

6. A nonvolatile semiconductor memory device according to claim 3, comprising a plurality of cells in the channel length direction and in a channel width direction, wherein first control gates of a line of cells continuous in the channel length or width direction are shared in common as one first control gate line, and second control gates of a line of cells continuous in a direction perpendicular to the first control gate line are shared in common as one second control gate line.

7. The nonvolatile semiconductor memory device of claim 3, further comprising means for writing to the cell when the source and drain diffusion regions of the cell are at the same potential.

8. The nonvolatile semiconductor memory device of claim 3, further comprising means for writing to the cell by causing electrons to be ejected from the floating gate into the substrate so as to lower a threshold voltage of the cell.

9. The nonvolatile semiconductor memory device of claim 8, wherein said means for writing causes the threshold voltage of the cell to be decreased to a value of from 1 to 2 V.

10. The nonvolatile semiconductor memory device of claim 3, further comprising means for erasing the cell by causing electrons to be injected from the substrate into the floating gate so as to increase a threshold voltage of the cell.

11. The nonvolatile semiconductor memory device of claim 10, wherein said means for erasing causes the threshold voltage of the cell to be increased to a value of at least 4V.

\* \* \* \* \*